(12) United States Patent
Kawamoto et al.

(10) Patent No.: US 9,341,977 B2
(45) Date of Patent: May 17, 2016

(54) LIGHT EMISSION APPARATUS, OPTICAL SCANNING APPARATUS HAVING LIGHT EMISSION APPARATUS, AND IMAGE FORMING APPARATUS

(71) Applicant: CANON KABUSHIKI KAISHA, Tokyo (JP)

(72) Inventors: Tomohiro Kawamoto, Tokyo (JP); Yuta Nito, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/396,018

(22) PCT Filed: Apr. 22, 2013

(86) PCT No.: PCT/JP2013/002694
§ 371 (c)(1),
(2) Date: Oct. 21, 2014

(87) PCT Pub. No.: WO2013/161258
PCT Pub. Date: Oct. 31, 2013

(65) Prior Publication Data
US 2015/0116435 A1     Apr. 30, 2015

(30) Foreign Application Priority Data

Apr. 24, 2012 (JP) .................. 2012-098681
Apr. 26, 2012 (JP) .................. 2012-100969

(51) Int. Cl.
| G03G 15/043 | (2006.01) |
| B41J 2/47 | (2006.01) |
| G02B 26/12 | (2006.01) |
| H01S 5/06 | (2006.01) |

(52) U.S. Cl.
CPC ............... *G03G 15/043* (2013.01); *B41J 2/473* (2013.01); *G02B 26/123* (2013.01); *H01S 5/06* (2013.01); *G02B 26/127* (2013.01)

(58) Field of Classification Search
CPC .......... B41J 2/385; B41J 2/473; G02B 26/08; G02B 26/123; G02B 26/127
See application file for complete search history.

(56) References Cited

U.S. PATENT DOCUMENTS

| 2006/0133435 A1 | 6/2006 | Ikeda | |
| 2007/0285491 A1* | 12/2007 | Kishimoto | B41J 2/473 347/233 |
| 2011/0228037 A1* | 9/2011 | Omori | G03G 15/043 347/247 |

FOREIGN PATENT DOCUMENTS

| CN | 1822455 A | 8/2006 |
| CN | 101040567 A | 9/2007 |
| CN | 101086643 A | 12/2007 |
| CN | 101090196 A | 12/2007 |
| CN | 101193755 A | 6/2008 |
| CN | 101582240 A | 11/2009 |

(Continued)

*Primary Examiner* — Sarah Al Hashimi
(74) *Attorney, Agent, or Firm* — Canon USA, Inc. IP Division

(57) ABSTRACT

A light emission apparatus includes a detection unit, a first drive unit, and a second drive unit. The detection unit detects the state of a detection element. The first drive unit controls the light amount of a light beam to be emitted by a first light emitting element based on the state of the detection element detected by the detection unit. The second drive unit controls the light amount of a light beam to be emitted by a second light emitting element based on the state of the detection element detected by the detection unit.

15 Claims, 15 Drawing Sheets

(56) References Cited

FOREIGN PATENT DOCUMENTS

| | | |
|---|---|---|
| EP | 1439619 A2 | 7/2004 |
| JP | 2004-012760 A | 1/2004 |
| JP | 2006-150601 A | 6/2006 |
| JP | 2007-148356 A | 6/2007 |
| JP | 2007-203543 A | 8/2007 |
| JP | 2007-329429 A | 12/2007 |
| JP | 2008-076496 A | 4/2008 |
| JP | 4513528 B2 | 7/2010 |
| JP | 2011-212976 A | 10/2011 |

\* cited by examiner

LIGHT EMISSION APPARATUS, OPTICAL SCANNING APPARATUS HAVING LIGHT EMISSION APPARATUS, AND IMAGE FORMING APPARATUS

TECHNICAL FIELD

The present invention relates to a light emission apparatus, an optical scanning apparatus having the light emission apparatus, and an image forming apparatus.

BACKGROUND ART

An electrophotographic image forming apparatus exposes a photosensitive member to a light beam (laser beam) emitted from a light source, such as semiconductor laser, to form an electrostatic latent image on the photosensitive member, and develops the image by using toner.

The light amount of a light beam depends on the temperature of a light source. In the case of semiconductor laser, for example, a rise in temperature of semiconductor laser causes light amount variation, i.e., reduction in amount of light emission for an identical drive current (degradation in droop characteristics).

Japanese Patent Application Laid-Open No. 2006-150601 discusses a method for driving a light emitting element described below as a technique for restricting light amount variation in a light beam emitted from a light source due to temperature variation. An image forming apparatus discussed in Japanese Patent Application Laid-Open No. 2006-150601 drives a light emitting element not used for image forming, detects its operating state (for example, the amount of variation in drive current value having a temperature dependency), and controls the light amount of a light beam emitted from a light emitting element used for image forming based on the detected operating state. The technique discussed in Japanese Patent Application Laid-Open No. 2006-150601 enables correcting the light amount of a light beam varying with temperature change, without providing on the light emitting element a unit for detecting the temperature.

In an apparatus having a plurality of drive units for respectively driving different light emitting elements out of a plurality of light emitting elements, if each of the plurality of drive units drives a light emitting element based on the method for driving a light emitting element discussed in Japanese Patent Application Laid-Open No. 2006-150601, the following problem arises. Specifically, since there is an individual difference between circuit configurations of the plurality of drive units, each drive unit supplies a slightly different drive current to a light emitting element not used for image forming, based on a common setting value. Therefore, if each drive unit individually performs control as discussed in Japanese Patent Application Laid-Open No. 2006-150601, there arises a difference in light volume between light beams emitted from the plurality of light emitting elements used for image forming controlled by respective drive circuits.

SUMMARY OF INVENTION

According to an aspect of the present invention, a light emission apparatus includes a light source including a plurality of light emitting elements including a first light emitting element and a second light emitting element configured to emit a light beam, and a detection element; a first drive unit configured to drive the first light emitting element to emit the light beam; a second drive unit configured to drive the second light emitting element to emit the light beam; and a detection unit configured to detect an operating state of the detection element, wherein the first drive unit controls a light amount of the light beam to be emitted by the first light emitting element based on the operating state of the detection element detected by the detection unit, and the second drive unit controls a light amount of the light beam to be emitted by the second light emitting element based on the operating state of the detection element detected by the detection unit.

According to another aspect of the present invention, an image forming apparatus includes a photosensitive member; a light source including a plurality of light emitting elements including a first light emitting element and a second light emitting element configured to emit a light beam for exposing the photosensitive member to light, and a detection element; a first drive unit configured to drive the first light emitting element to emit the light beam; a second drive unit configured to drive the second light emitting element to emit the light beam; and a detection unit configured to detect a state of the detection element, wherein the first drive unit controls a light amount of the light beam to be emitted by the first light emitting element based on the state of the detection element detected by the detection unit, and the second drive unit controls a light amount of the light beam to be emitted by the second light emitting element based on the state of the detection element detected by the detection unit.

Further features of the present invention will become apparent from the following description of exemplary embodiments with reference to the attached drawings.

DESCRIPTION OF EMBODIMENTS

Figure 1:
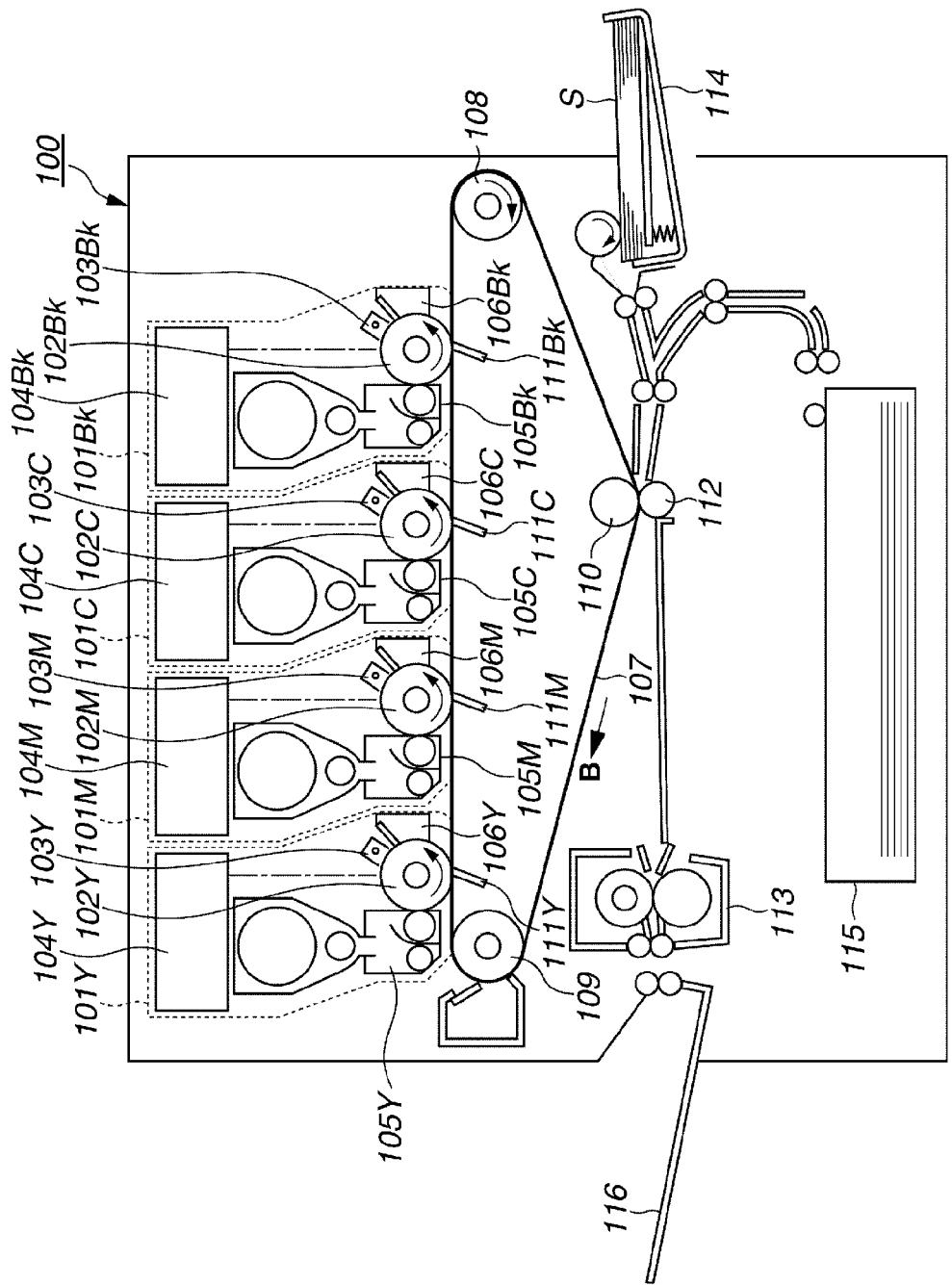
FIG. 1 is a cross sectional view schematically illustrating a color image forming apparatus.

FIG. 1 is a cross sectional view schematically illustrating a digital full-color printer (a color image forming apparatus) which performs image formation by using a plurality of colors of toner according to a first exemplary embodiment. Although, in the following exemplary embodiments, a color image forming apparatus and an optical scanning apparatus included therein are described, exemplary embodiments are not limited to a color image forming apparatus and an optical scanning apparatus included therein. An image forming apparatus which performs image formation with monochrome (for example, black) toner and an optical scanning apparatus included therein are also applicable to exemplary embodiments.

An image forming apparatus 100 includes four image forming units 101Y, 101M, 101C, and 101Bk for forming images of different colors. Subscripts Y, M, C, and Bk represent yellow, magenta, cyan, and black, respectively. The image forming units 101Y, 101M, 101C, and 101Bk perform image formation by using yellow, magenta, cyan, and black toner, respectively.

The image forming units 101Y, 101M, 101C, and 101Bk include photosensitive drums 102Y, 102M, 102C, and 102Bk, respectively, which are photosensitive members. Charging unit 103Y, 103M, 103C, and 103BK, optical scanning apparatuses (light emission apparatuses) 104Y, 104M, 104C, and 104Bk, developing units 105Y, 105M, 105C, and 105Bk are disposed around the photosensitive drums 102Y, 102M, 102C, and 102Bk, respectively. Drum cleaning units 106Y, 106M, 106C, and 106Bk are disposed around the photosensitive drums 102Y, 102M, 102C, and 102Bk, respectively.

An intermediate transfer belt 107 (an endless belt) is disposed under the photosensitive drums 102Y, 102M, 102C, and 102Bk. The intermediate transfer belt 107 is stretched by a driving roller 108 and driven rollers 109 and 110, and rotates in the direction of the arrow B illustrated in FIG. 1 during image formation. Via the intermediate transfer belt 107 (an intermediate transfer member), primarily transfer units 111Y, 111M, 111C, and 111Bk are disposed at positions facing the photosensitive drums 102Y, 102M, 102C, and 102Bk, respectively.

The image forming apparatus 100 according to the present exemplary embodiment includes a secondary transfer unit 112 for transferring a toner image on the intermediate transfer belt 107 onto a recording medium S, and a fixing unit 113 for fixing the toner image on the recording medium S.

The following describes the image forming process ranging from the charging process to the developing process of the image forming apparatus 100 having the above-described configuration. Since each image forming unit performs an identical image forming process, the image forming process of the image forming unit 101Y will be described below, and a description about the image forming process of the image forming units 101M, 101C, and 101Bk will be omitted.

First of all, the charging unit 103Y of the image forming unit 101Y charges the photosensitive drum 102Y, which is rotatably driven. The charged photosensitive drum 102Y (an image bearing member) is exposed to a laser beam emitted from the optical scanning apparatus 104Y. Thus, an electrostatic latent image is formed on the rotating photosensitive member. Then, the electrostatic latent image is developed as a yellow toner image by the developing unit 105Y.

The image forming process from the secondary transfer process on will be described below based on the image forming unit 101Y. When the primarily transfer units 111Y, 111M, 111C, and 111Bk apply a transfer bias to the intermediate transfer belt 107, the yellow, magenta, cyan, and black toner images formed on the photosensitive drums 102Y, 102M, 102C, and 102Bk of the image forming units 101Y, 101M, 101C, and 101Bk are transferred onto the intermediate transfer belt 107, respectively. Thus, toner images of respective colors are superimposed on the intermediate transfer belt 107.

The toner images of four colors are transferred onto the intermediate transfer belt 107 to form a 4-color toner image on the intermediate transfer belt 107. Then, at a secondary transfer portion T2, the 4-color toner image is transferred onto the recording medium S, which has been conveyed from a manual feed cassette 114 or a sheet cassette 115 by the secondary transfer unit 112 (secondary transfer process). Then, the toner image on the recording medium S is heated by the fixing unit 113, and then discharged onto a discharge unit 116. Thus, a full-color image is obtained on the recording medium S.

After completion of transfer, residual toner on the photosensitive drums 102Y, 102M, 102C, and 102Bk is removed by the drum cleaning units 106Y, 106M, 106C, and 106Bk, respectively. Subsequently, the above-described image forming process is performed.

Figure 2:
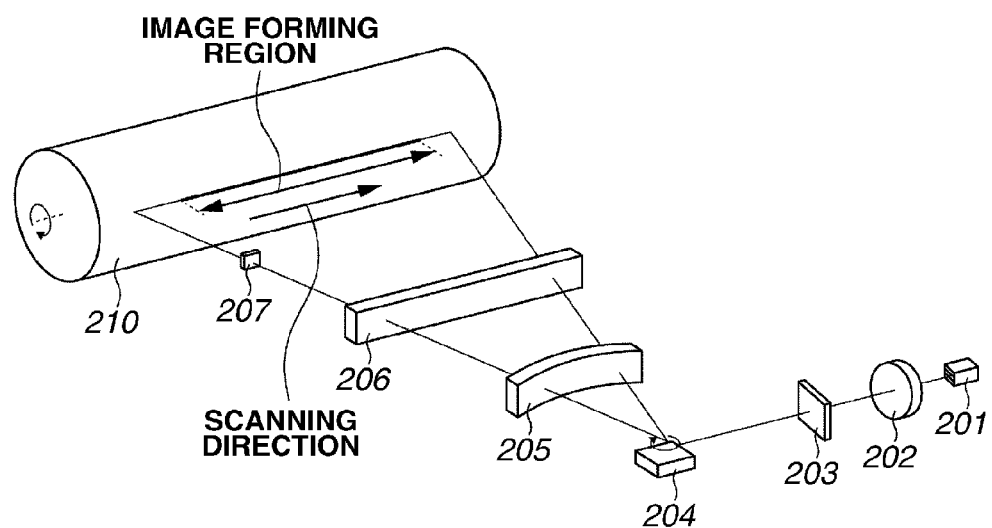
FIG. 2 is a schematic view illustrating an optical scanning apparatus.

The following describes the configuration of the optical scanning apparatuses 104Y, 104M, and 104C and 104Bk with reference to FIG. 2. Since each optical scanning apparatus has an identical configuration, subscripts Y, M, C, and Bk indicating respective colors are omitted.

The optical scanning apparatus 104 includes a laser light source 201 for generating a laser beam (a light beam), a collimator lens 202 for shaping the laser beam into a parallel beam, a cylindrical lens 203 for condensing the laser beam that has passed the collimator lens 202 in a sub scanning direction (the direction corresponding to the rotational direction of the photosensitive member), and a rotating polygon mirror 204. The optical scanning apparatus 104 further includes f-theta lenses A205 and B206 entered by the laser beam (a scanning light) deflected by the polygon mirror 204. The optical scanning apparatus 104 further includes a beam detector (BD) 207, which is a signal generation unit for detecting the laser beam deflected by the polygon mirror 204, and outputting a horizontal synchronization signal upon detection.

Figure 3:
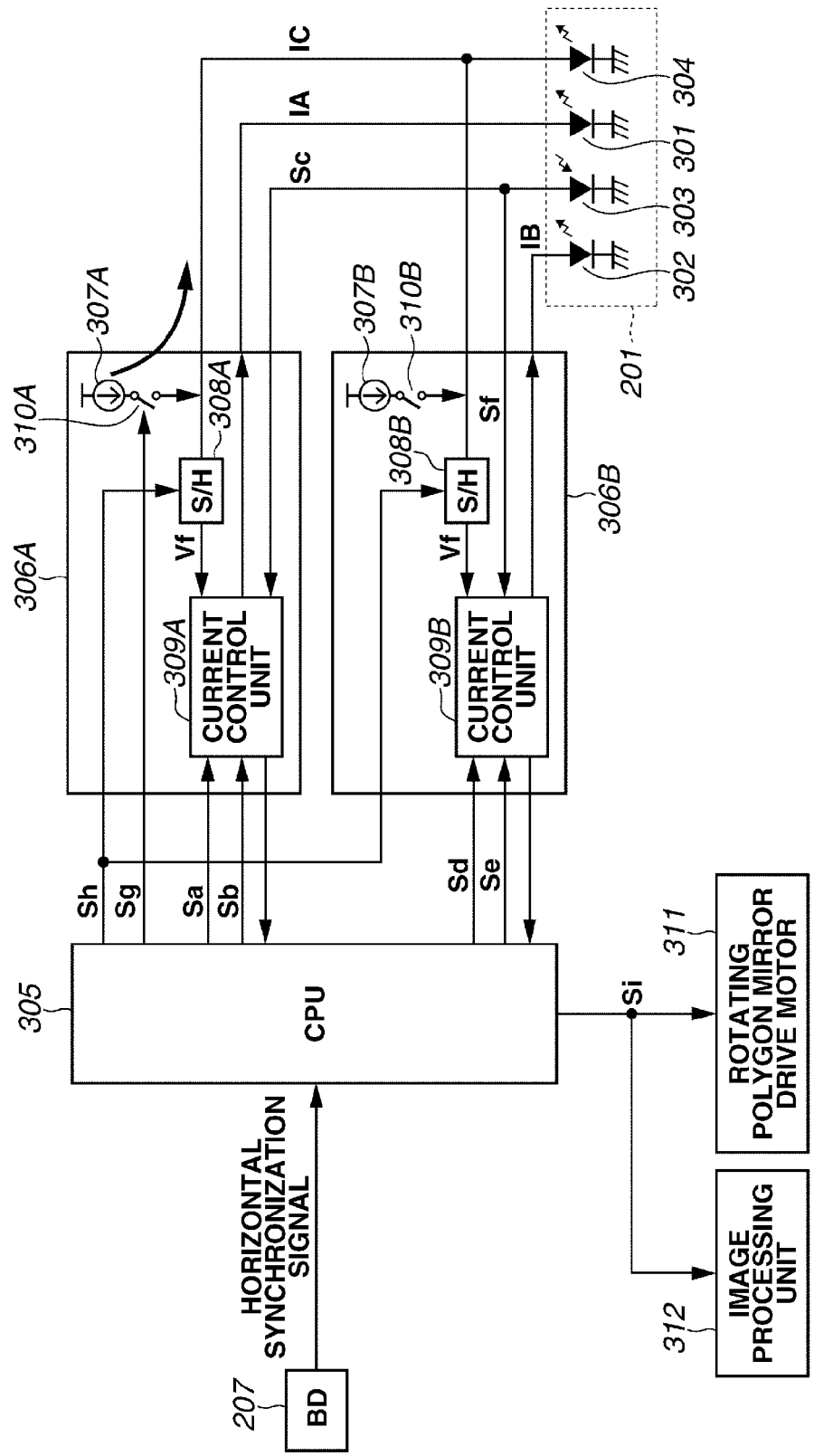
FIG. 3 is a control block diagram illustrating an image forming apparatus according to a first exemplary embodiment.

FIG. 3 is a control block diagram illustrating the image forming apparatus 100 according to the present exemplary embodiment. The laser light source 201 includes a plurality of light emitting elements on one chip (a package or substrate). Referring to FIG. 3, although different laser drive units (described below) respectively control a light emitting element 301 (a first light emitting element) and a light emitting element 302 (a second light emitting element), each laser drive circuit may control the plurality of light emitting elements. The laser light source 201 includes a photo diode (PD) 303, which is a light receiving element for receiving laser beams emitted from the light emitting elements 301 and 302. The PD 303 is provided to detect the light amount of the laser beams emitted from the light emitting elements 301 and 302. The laser light source 201 according to the present exemplary embodiment is an edge face light emission type semiconductor laser device, which emits laser beams in two different di-rections horizontal to the substrate surface of the chip. The laser beam emitted from the laser light source 201 to one side is led to the photosensitive drum 102, and the laser beam emitted to the other side enters the PD 303.

The form of embodiment of the laser light source 201 is not limited to the edge face light emission type semiconductor laser, and may be the vertical cavity surface emitting laser (VCSEL) Unlike the edge face light emission type semiconductor laser, the VCSEL emits a laser beam only in one direction. Therefore, with the optical scanning apparatus 104 using the VCSEL as an exposure light source for the photosensitive members, the laser beam emitted in the one direction is split by a beam splitter, the one split laser light is led to the photosensitive member, and the other laser beam is led to enter a photo diode disposed outside the laser light source 201.

The laser light source 201 further includes a detection element 304 (described below).

A CPU 305 (a control unit) controls a laser drive unit 306A (a first drive unit) and a laser drive unit 306B (a second drive unit). The CPU 305 inputs a horizontal synchronization signal (BD signal) from the BD 207, and outputs control signals Sa, Sb, Sd, Se, Sg, Sh, and Si (described below) to the laser drive units 306A and 306B at a timing based on the horizontal synchronization signal. The laser drive units 306A and 306B output a completion signal (described below) to the CPU 305.

The laser drive unit 306A includes a current source 307A, a sample/hold (S/H) circuit 308A as a first detection unit, a current control unit 309A, and a switch 310A. The laser drive unit 306B includes a current source 307B, a sample/hold (S/H) circuit 308B as a second detection unit, a current control unit 309B, and a switch 310B. Although the laser drive units 306A and 306B according to the present exemplary embodiment have an identical circuit configuration, the laser drive unit 306B may not have a circuit configuration without the current source 307B and the switch 310B.

The current control unit 309A of the laser drive unit 306A supplies a drive current $I_A$ to the light emitting element 301 upon input of the control signal Sa (an emission instruction signal) output from the CPU 305.

The current source 307A of the laser drive unit 306A is connected to the switch 310A. The CPU 305 outputs the control signal Sg to perform ON/OFF control of the switch 310A. While the switch 310A is ON, the drive current Ic is supplied from the current source 307A to the detection element 304 as a detection current. When the exposure position of the laser beam deflected by the rotating polygon mirror 204 is other than an image forming region illustrated in FIG. 2 (a non-image forming region), the CPU 305 outputs the control signal Sg. Specifically, the CPU 305 outputs the control signal Sg at a timing other than a period during which the laser beam scans the image forming region in one scanning period of the laser beam, to drive the detection element 304.

The current control unit 309B of the laser drive unit 306B supplies the drive current $I_B$ to the light emitting element 302 upon input of the control signal Sd (an emission instruction signal) output from the CPU 305. The control signal Sd output from the CPU 305 to the current control unit 309B corresponds to the control signal Sa.

The current source 307B of the laser drive unit 306B is connected to the switch 310B. However, no control signal is supplied from the CPU 305 to the switch 310B and, therefore, the switch 310B is constantly OFF. Accordingly, no drive current is supplied from the current source 307B.

The CPU 305 outputs the control signal Si to a rotating polygon mirror drive motor 311 to instruct the rotating polygon mirror drive motor 311 to rotatably drive the rotating polygon mirror 204. The CPU 305 outputs the control signal Si to the image processing unit 312 to instruct the image processing unit 312 to output image data.

Figure 4:
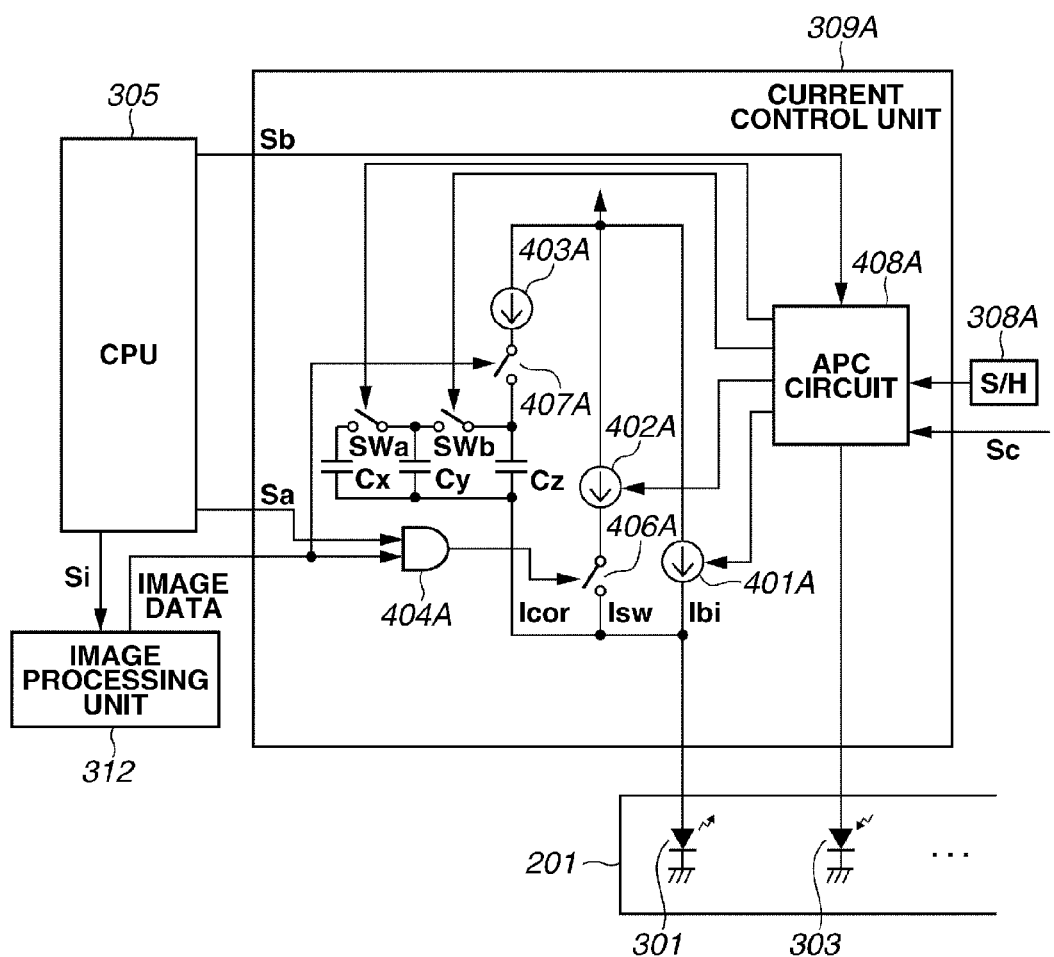
FIG. 4 is a block diagram illustrating a current control circuit according to the first exemplary embodiment.

The following describes the configuration of the current control units 309A and 309B with reference to FIG. 4. FIG. 4 illustrates in detail the current control unit 309A illustrated in FIG. 3.

The current control unit 309A includes a bias current source 401A, a switching current source 402A, a correction current source 403A, an AND circuit 404A, switches 406A and 407A, and an automatic power control (APC) circuit 408A.

The current control unit 309B, having a similar configuration to that of the current control unit 309A, includes a bias current source 401B, a switching current source 402B, a correction current source 403B, an AND circuit 404B, switches 406B and 407B, and an APC circuit 408B (not illustrated).

As described above, the current control units 309A and 309B according to the present exemplary embodiment have an identical configuration. Therefore, the current control unit 309A will be described below, and a description about the current control unit 309B will be omitted.

First of all, the bias current source 401A will be described below. The bias current source 401A supplies a bias current Ibi (a standby current) to the light emitting element 301 during image formation. Semiconductor laser is known to emit a minute amount of light when a drive current less than a threshold current Ith is supplied, and emit a large amount of light when a drive current equal to or larger than the threshold current Ith is supplied. Taking advantage of the above-described characteristics, during image formation, the bias current source 401A supplies to the light emitting element 301 the bias current Ibi determined based on the threshold current Ith. Specifically, the value of the bias current Ibi serves as a reference point for the drive current supplied to the light emitting element 301 during image formation. Supplying the bias current Ibi to the light emitting element 301 enables providing a favorable light emission response when a switching current Isw (described below) is supplied.

The switching current source 402A will be described below. The switching current source 402A supplies the switching current Isw to the light emitting element 301. The switch 406A on the output side of the switching current source 402A is connected to the AND circuit 404A. The AND circuit 404A inputs the control signal Sa, and image data (binary data) from the image processing unit 312, and outputs the logical sum of the control signal Sa and the image data to the switch 406. For example, when the AND circuit 404A inputs the control signal Sa of the High level from the CPU 305 and image data of the High level from the image processing unit 312, the switch 406A turns ON. Then, the switching current Isw is supplied from the switching current source 402A to the light emitting element 301. Specifically, the bias current Ibi is supplied from the bias current source 401A to the light emitting element 301, and the switching current Isw is supplied from the switching current source 402A to the light emitting element 301. Then, the light emitting element 301 emits a laser beam having a light amount corresponding to the sum of the bias current Ibi and the switching current Isw.

Meanwhile, when the AND circuit 404A inputs the control signal Sa of the High level from the CPU 305 and the image data of the Low level from the image processing unit 312, the switch 406A turns OFF. In this state, the bias current Ibi is supplied from the bias current source 401A to the light emitting element 301, and the switching current Isw is not supplied from the switching current source 402A to the light emitting element 301. Further, when the AND circuit 404A inputs the control signal Sa of the Low level from the CPU 305, the switch 406A turns OFF. In this state, the switching current Isw is not supplied to the light emitting element 301.

The following describes the configuration for performing automatic power control (APC) provided in the laser drive unit 306A. APC is intended to set the values of the bias current Ibi and the switching current Isw. The APC circuit 408A of the laser drive unit 306A inputs the control signal Sb (refer to FIG. 3) from the CPU 305. The CPU 305 outputs the control signal Sb to the APC circuit 408 of the laser drive unit 306A to instruct the APC circuit 408 to execute APC for the light emitting element 301. Although, in the present exemplary embodiment, the current control unit 309A drives one light emitting element, the current control unit 309A actually drives a plurality of light emitting elements. Therefore, the control signal Sb indicates any one light emitting element for which APC is to be executed, out of the plurality of light emitting elements. This also applies to the control signal Se input from the CPU 305 to the current control unit 309B (the APC circuit 408B) illustrated in FIG. 3.

Upon input of the control signal Sb from the CPU 305, the APC circuit 408A executes APC for the light emitting element 301 in the non-image forming region period in one scanning period. The APC circuit 408A inputs the light amount signal Sc detected by the PD 303 illustrated in FIG. 3. The APC circuit 408A controls the value of the drive current $I_A$ supplied to the light emitting element 301 so that the light amount detected by the PD 303 equals target light amounts P1 and P2 (described below).

Figure 5:
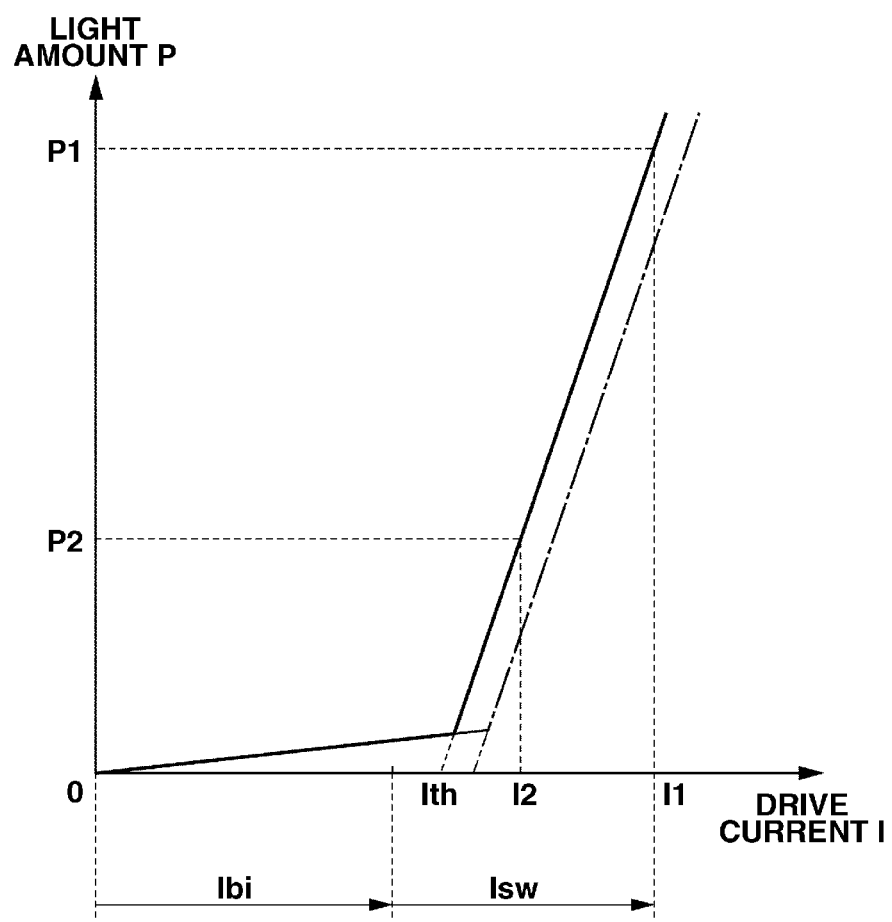
FIG. 5 illustrates the light emitting characteristics of semiconductor laser.

A method for setting the value of the bias current Ibi will be described below. FIG. 5 illustrates a relation between the drive current supplied to the light emitting element (semiconductor laser) and the light amount of the laser beam (light emitting characteristics). When a drive current smaller than the threshold current Ith is supplied to the light emitting element, the light emitting element emits spontaneous emission light having a minute light amount. Otherwise, when a drive current equal to or larger than the threshold current Ith is supplied to the light emitting element, the light emitting element emits a laser beam. The value of the bias current Ibi is set to a value close to the threshold current Ith by increasing or decreasing the threshold current Ith by a predetermined value, or by multiplying the threshold current Ith by a predetermined coefficient.

The light emitting characteristics illustrated in FIG. 5 vary with the temperature of the laser light source 201. For example, a temperature rise fluctuates the light emitting characteristics as indicated by the chain line in FIG. 5. As illustrated in FIG. 5, the value of the threshold current Ith varies (shifts to the right) by the temperature of the laser light source 201. Therefore, when the value of the bias current Ibi is fixed, temperature variation in the laser light source 201 may cause degradation in the light emission response of the light emitting element.

Accordingly, the CPU 305 derives the threshold current Ith for each scanning period, and calculates the value of the bias current Ibi based on the derived threshold current Ith. The threshold current Ith is derived as follows. The CPU 305 changes the drive current supplied to the light emitting element to instruct the APC circuit 408 to measure a drive current I1 which produces the light amount P1 (the light amount of received light of the PD) detected by the PD 303 (refer to FIG. 5).

Then, the CPU 305 varies the drive current supplied to the light emitting element, and measures a drive current I2 (I1>I2) which produces the light amount P2 detected by the PD 303 (refer to FIG. 5).

Then, the CPU 305 determines as the threshold current Ith an intersection between a straight line (formed by connecting points (I1, P1) and (I2, P2)) and a line segment for the light amount 0, and then determines the value of the bias current Ibi by increasing or decreasing the threshold current Ith by a predetermined value, or by multiplying the threshold current Ith by a predetermined coefficient.

A method for setting the value of the switching current Isw will be described below. In the present exemplary embodiment, the target light amount P1 of the laser beam is used during image formation. It is known that the setting of the drive current I1 supplied to the light emitting element based on the above-described measurement result produces a laser beam having the light amount P1. Therefore, as illustrated in FIG. 5, the CPU 305 sets as the switching current Isw a value obtained by subtracting the bias current Ibi from the drive current I1. Therefore, the drive current $I_A$ is the sum of the bias current Ibi and the switching current Isw obtained as described above.

The correction current source 403A will be described below. In synchronization with the switching current source 402A starting supplying the switching current Isw to the light emitting element 301, the correction current source 403A supplies the correction current Icor to the light emitting element 301. The correction current Icor is supplied to the light emitting element 301 to correct a light emission delay of the laser beam emitted from the light emitting element 301 with respect to the drive current $I_A$.

Figure 6:
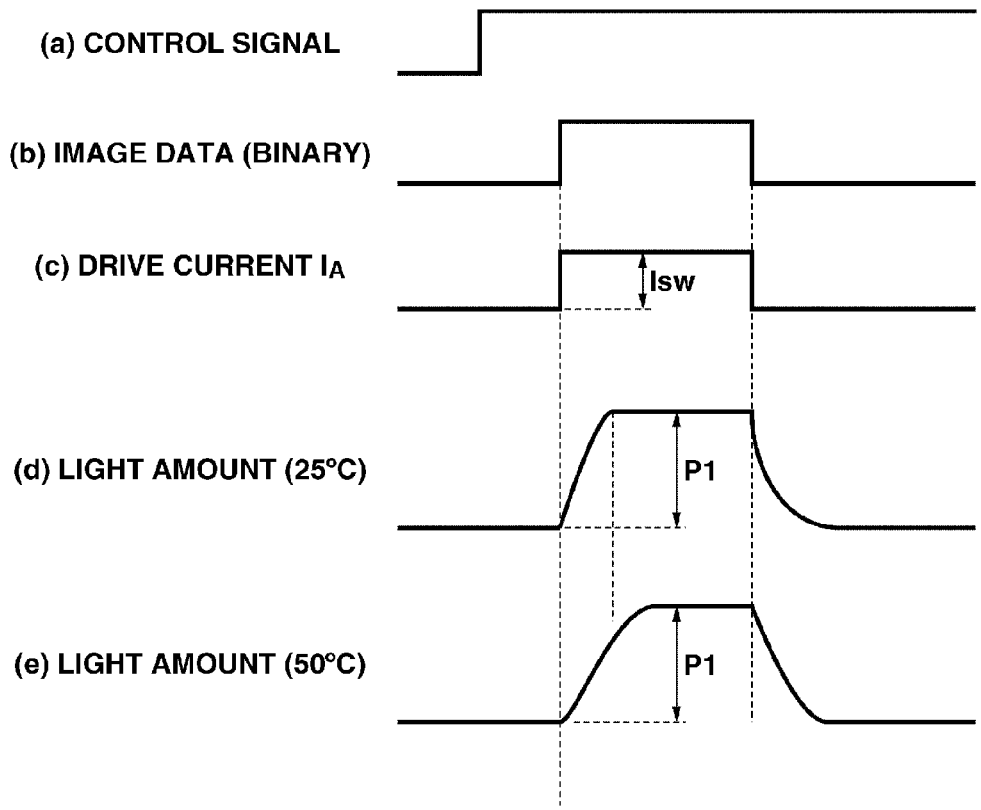
FIG. 6 is a timing chart illustrating a relation between the drive current and the light amount waveform.

The following describes the light emission delay of the laser beam with respect to image data input to the AND circuit 404A, with reference to FIG. 6. FIG. 6 is a timing chart illustrating a relation among the control signal Sa, the image data, the drive current $I_A$, and the light amount waveform of the laser beam. Referring to FIG. 6, line (a) indicates the control signal Sa input from the CPU 305 to the AND circuit 404A of the current control unit 309A, line (b) indicates the image data input to the AND circuit 404A, line (c) indicates the drive current $I_A$ supplied to the light emitting element 301, line (d) indicates the light amount waveform of the laser beam when the temperature of the laser light source 201 is 25 degrees (Celsius), and line (e) indicates the light amount waveform of the laser beam when the temperature of the laser light source 201 is 50 degrees (Celsius).

As illustrated in FIG. 6, when the AND circuit 404A inputs the control signal Sa and the image data, the switch 406A turns ON and then the drive current $I_A$ (=Ibi+Isw) is supplied to the light emitting element 301. Ideally, it is desirable that, when the drive current $I_A$ (=Ibi+Isw) is supplied to the light emitting element 301, the light emitting element 301 outputs a laser beam having a square light amount waveform similar to the rectangular image data. However, as illustrated in lines (d) and (e) of FIG. 6, even when the drive current $I_A$ is supplied to the light emitting element 301, the light amount of the laser beam does not immediately rise to the target light amount P1, but reaches the target light amount P1 behind the rising edge of the image data because of the characteristics of the laser light source 201. This delay is referred to as light emission delay. The generation of such a light emission delay reduces the density at image edges, or degrades the sharpness of edges of a character image.

To reduce the light emission delay time, the correction current source 403A of the laser drive unit 306A supplies the correction current Icor to the light emitting element 301 in synchronization with the start of supplying the switching current Isw to the light emitting element 301. More specifically, the correction current source 403A supplies the correction current Icor during a predetermined time period since the start of supplying the switching current Isw. Likewise, the correction current source 403B of the laser drive unit 306B supplies the correction current Icor to the light emitting element 302 in synchronization with the start of supplying the switching current Isw to the light emitting element 302. More specifically, the correction current source 403B supplies the correction current Icor during a predetermined time period since the start of supplying the switching current Isw. When the correction current Icor is supplied to the light emitting elements 301 and 302 in this way, the sum of the drive current $I_A$ and the correction current Icor is supplied when light emission is started. Thus, the rising speed of the light amount waveform of the laser beam increases, resulting in a decreased light emission delay time.

As illustrated in lines (d) and (e) of FIG. 6, it is known on an experimental basis that the light emission delay time depends on the temperature of the laser light source 201. Therefore, setting the correction current Icor to a fixed current value disables suitable correction of the light emission delay when the temperature of the laser light source 201 varies. Accordingly, the image forming apparatus 100 according to the present exemplary embodiment detects the voltage of the detection element 304 (refer to FIG. 3) correlated with the temperature of the laser light source 201, and controls the value of the correction current Icor based on the result of the detection.

The detection element 304 included in the laser light source 201 will be described below. As illustrated in FIG. 3, the detection element 304 is fabricated on the same single chip as the light emitting elements 301 and 302, and emits a laser beam when the drive current Ic is supplied to the detection element 304. The current source 307A of the laser drive unit 306A is connected to the switch 310A. The CPU 305 outputs the control signal Sg to perform ON/OFF control of the switch 310A. While the switch 310A is ON, the drive current Ic is supplied from the current source 307A to the detection element 304. The current source 307B of the laser drive unit 306B is connected to the switch 310B. However, no control signal is input from the CPU 305 to the switch 310B and, therefore, the switch 310B is constantly OFF. Accordingly, no drive current is supplied from the current control unit 309B to the detection element 304, and the drive current Ic is supplied from the current control unit 309A to the detection element 304. The emitting port of the detection element 304 is masked to prevent the laser beam generated by detection element 304 from being emitted to the outside of the laser light source 201.

Figure 7A:
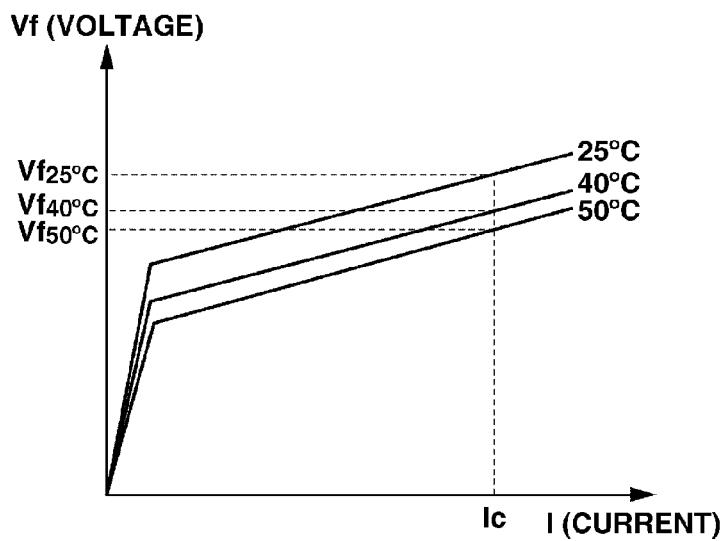
FIG. 7A illustrates a relation between the current and the voltage supplied to a detection element.
Figure 7B:
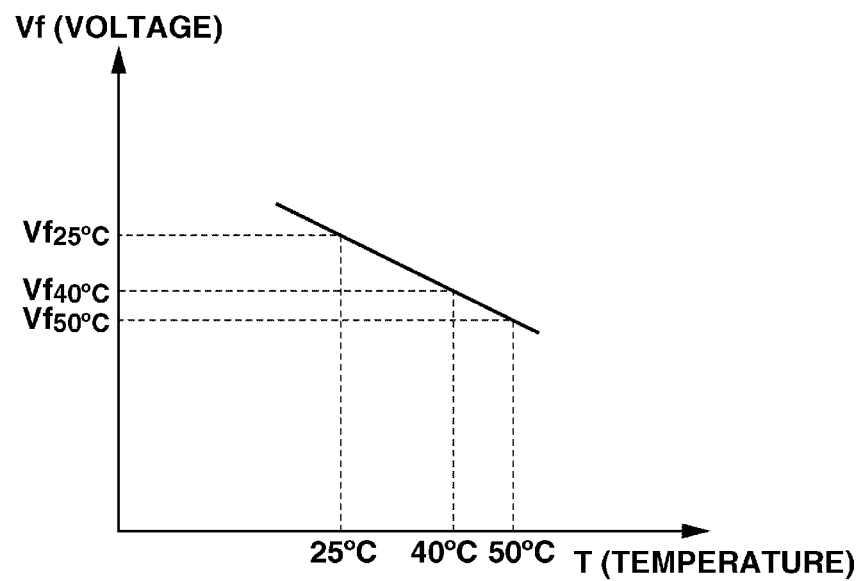
FIG. 7B illustrates a relation between the voltage applied to the detection element and the temperature of a laser light source.

The following describes a correlation between the voltage of the detection element 304 and the temperature of the laser light source 201. FIG. 7A illustrate a relation between the drive current I supplied to the detection element 304 and a voltage Vf of the detection element 304 at three different temperatures (25 degrees (Celsius), 40 degrees (Celsius), and 50 degrees (Celsius)). As illustrated in FIG. 7A, when the drive current Ic is supplied to the detection element 304, the voltage Vf decreases with rising temperature of the laser light source 201. FIG. 7B illustrate a relation between the temperature T of the laser light source 201 and the voltage Vf of the detection element 304 when the drive current Ic is supplied to the detection element 304. As illustrated in FIG. 7B, the temperature T of the laser light source 201 and the voltage Vf of the detection element 304 are in proportionality relation. Therefore, detecting the voltage Vf of the detection element 304 enables detecting the state (hereinafter referred to as operating state) of the laser light source 201 corresponding to the temperature, without attaching a temperature detecting element, such as a thermistor, to the laser light source 201.

As described above, the CPU 305 outputs the control signal Sg to perform ON/OFF control of the switch 310A. While the switch 310A is ON, the drive current Ic is supplied from the current source 307A to the detection element 304 as a detection current. While the drive current Ic is being supplied to the detection element 304, the CPU 305 outputs the control signal Sh to the S/H circuits 308A and 308B. The S/H circuits 308A and 308B detect the voltage of the detection element 304 with the drive current Ic supplied according to the control signal Sh. The S/H circuit 308A outputs the detection result Vf to the APC circuit 408A of the current control unit 309A. The S/H circuit 308B outputs the detection result Vf to the APC circuit 408B of the current control unit 309B.

Although, in the present exemplary embodiment, the laser drive unit 306A includes the S/H circuit 308A, and the laser drive unit 306B includes the S/H circuit 308B, exemplary embodiments are not limited to this configuration. For example, it is also possible that an S/H circuit for detecting the voltage of the detection element 304 is provided outside the laser drive units 306A and 306B, and the relevant S/H circuit outputs the detection result Vf to the laser drive units 306A and 306B.

The S/H circuit 308A is provided with a grounding terminal (not illustrated) and is grounded via the grounding terminal. The S/H circuit 308A is further provided with an input terminal. As illustrated in FIG. 3, the input terminal of the S/H circuit 308A is connected to the input terminal of the detection element 304 to which the drive current Ic is input. The S/H circuit 308A outputs to the current control unit 309A a potential difference Vf between the input terminal of the S/H circuit 308A and the grounding terminal in a state where the drive current Ic is supplied upon input of the control signal Sh (described below). Similarly, the S/H circuit 308B is provided with a grounding terminal (not illustrated), and the laser drive unit 306B is grounded via the grounding terminal. The S/H circuit 308B is further provided with an input terminal. As illustrated in FIG. 3, the input terminal of the S/H circuit 308B is connected to the input terminal of the detection element 304 to which the drive current Ic is input. The S/H circuit 308B outputs to the current control unit 309B a potential difference Vf between the input terminal of the S/H circuit 308B and the grounding terminal in a state where the drive current Ic is supplied upon input of the control signal Sh (described below).

Internal memories of the APC circuits 408A and 408B store reference voltages V1 and V2 (<V1) to be compared with the potential difference Vf. A relation between the result of comparison of V1 and V2 with Vf and the temperature of the laser light source 201 is illustrated in Table 1.

TABLE 1

|  | Vf ≤ V2 | V2 < Vf ≤ V1 | V1 < Vf |
| --- | --- | --- | --- |
| Laser light source temperature | 40° C. or higher | 25° C. or higher and lower than 40° C. | Lower than 25° C. |

As illustrated in FIG. 4, the correction current source 403A is connected to the switch 407A subjected to ON/OFF control according to the image data supplied from the image processing unit 312. The switch 407A includes capacitors Cx, Cy, and Cz, and switches SWa and SWb configured as illustrated in FIG. 4.

When the image data input from the image processing unit 312 is at the Low level, the switch 407A turns OFF and, therefore, the correction current Icor is not supplied to the light emitting element 301. Otherwise, when the image data input from the image processing unit 312 is at the High level, the switch 407A is turns ON and, therefore, a pulse-shaped current passes through the switch 407A. The capacitors Cx, Cy, and Cz and the switches SWa and SWb form a circuit for controlling the value of the pulse-shaped current which has passed through the switch 407A and converging the current value with a predetermined time constant. Performing ON/OFF control of the switches Swa and Swb enables controlling the value of the correction current Icor supplied to the light emitting element 301 and the convergence time.

The APC circuit 408A sets the ON/OFF state of the switches SWa and SWb based on the signal Vf from the S/H circuit 308A. When the signal Vf input from the S/H circuit 308A to the APC circuit 408A is equal to or lower than the reference voltage V2, the APC circuit 408A controls the switches SWa and SWb to turn OFF. The reference voltage V2 is measured in the assembly process, and applied to the detection element 304 when the temperature of the laser light source 201 is set to 40 degrees (Celsius) and the drive current Ic is supplied to the detection element 304. The APC circuit 408A presumes whether the temperature of the laser light source 201 is equal to or higher than 40 degrees (Celsius) or lower than 40 degrees (Celsius) by using the voltage V2 as a threshold value. Specifically, the APC circuit 408A according to the present exemplary embodiment presumes that, when the signal Vf is equal to or lower than the reference voltage V2, the temperature of the laser light source 201 is equal to higher than 40 degrees (Celsius). As illustrated in FIG. 6, the light emission delay time increases with a rise in temperature of the laser light source 201. Therefore, when the signal Vf is equal to or lower than the reference voltage V2, the APC circuit 408A controls the switches SWa and SWb to turn OFF so that the value of the correction current Icor is maximized (refer to Table 2).

Further, when the signal Vf input from the S/H circuit 308A to the APC circuit 408A is higher than the reference voltage V2 and equal to or lower than the reference voltage V1, the APC circuit 408A controls the switch SWa to turn OFF, and controls the switch SWb to turn ON. The reference voltage V1 is measured in the assembly process, and applied to the detection element 304 when the temperature of the laser light source 201 is set to 25 degrees (Celsius) and the drive current Ic is supplied to the detection element 304. The APC circuit 407A presumes whether the temperature of the laser light source 201 is equal to or higher than 25 degrees (Celsius) or lower than 25 degrees (Celsius) by using the reference voltage V1 as a threshold value. Specifically, when the signal Vf is higher than the reference voltage V2 and equal to or lower than the reference voltage V1, the APC circuit 407A according to the present exemplary embodiment presumes that the temperature of the laser light source 201 is equal to or higher than 25 degrees (Celsius) and lower than 40 degrees (Celsius). The light emission delay when the temperature of the laser light source 201 is equal to or higher than 25 degrees (Celsius) and lower than 40 degrees (Celsius) is smaller than that when the relevant temperature is equal to or higher than 40 degrees (Celsius). In this case, when the signal Vf is higher than the reference voltage V2 and equal to or lower than the reference voltage V1, the APC circuit 407A controls the switch SWa to turn OFF, and controls the switch SWb to turn ON (refer to Table 2). The value of the correction current Icor when the switch SWa is OFF and the switch SWb is ON is larger than that when both the switches SWa and SWb are ON and smaller than that when both the switches SWa and SWb are OFF. The convergence time of the correction current Icor when the switch SWa is OFF and the switch SWb is ON is longer than that when both the switches SWa and SWb are ON and shorter than that when both the switches SWa and SWb are OFF (refer to Table 2).

When the signal Vf input from the S/H circuit 308A to the APC circuit 408A is higher than the reference voltage V1 (Vf>V1), the APC circuit 407A presumes that the temperature of the laser light source 201 is lower than 25 degrees (Celsius), controls the switch SWa to turn ON, and controls the switch SWb to turn ON.

TABLE 2

|  | Vf ≤ V2 | V2 < Vf ≤ V1 | V1 < Vf |
|---|---|---|---|
| Laser light source temperature | 40° C. or higher | 25° C. or higher and lower than 40° C. | Lower than 25° C. |
| Switch SWa | OFF | OFF | ON |
| Switch SWb | OFF | ON | ON |

The value and convergence time of the correction current Icor can be further seg-mentalized by increasing the number of capacitors, switches, and reference voltages. However, in the present exemplary embodiment, the value and convergence time of the correction current Icor can be controlled to three levels for the purpose of simple description.

Figure 8:
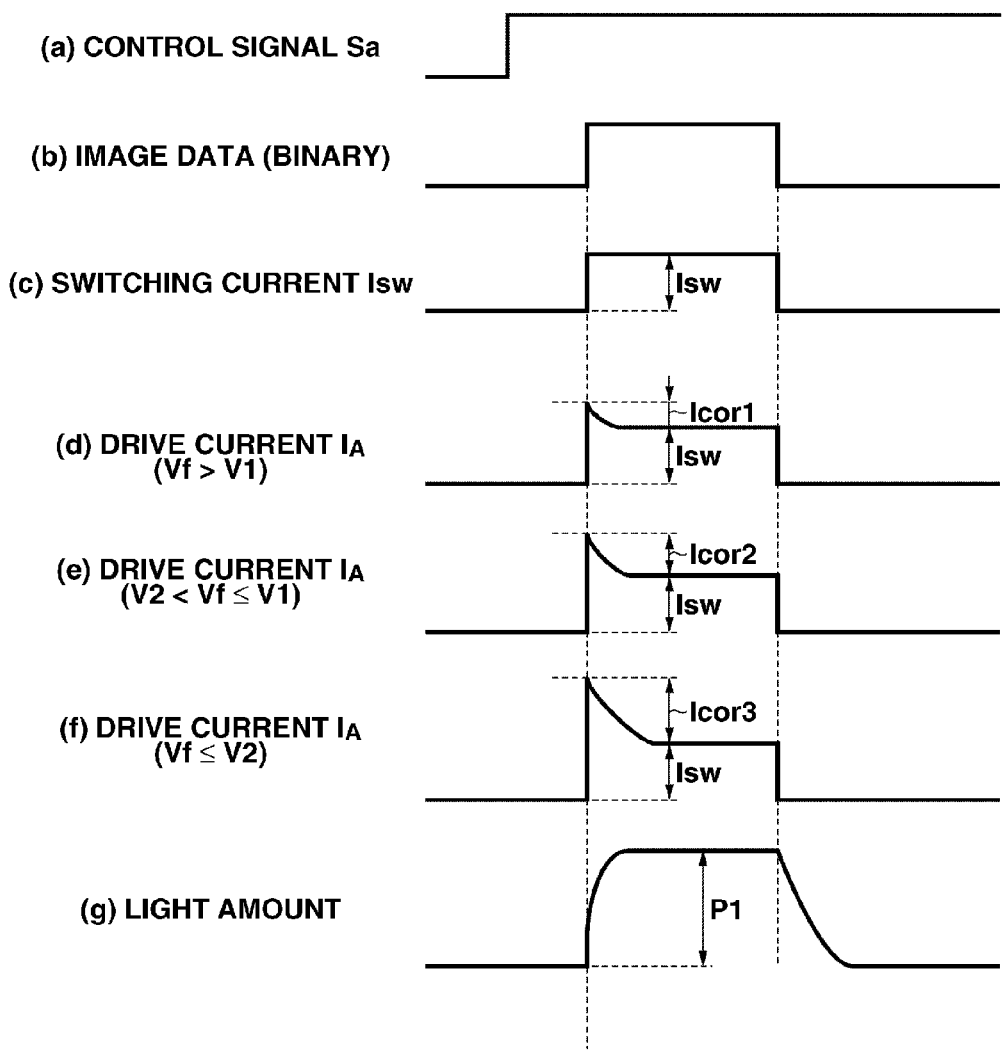
FIG. 8 is a timing chart illustrating a relation between the current and the light amount waveform.

FIG. 8 is a timing chart illustrating a relation among the control signal Sa, the image data, the switching current Isw, the correction current Icor, the drive current $I_A$, and the light amount of the laser beam. Referring to FIG. 8, line (a) indicates the control signal Sa input from the CPU 305 to the AND circuit 404A of the current control unit 309A, and line (b) indicates the image data input to the AND circuit 404A and the switch 407A.

Line (c) indicates the switching current Isw supplied to the light emitting element 301. lines (d), (e), and (f) indicate the drive current $I_A$ supplied to the light emitting element 301, containing the switching current Isw and the correction current Icor superimposed thereon. Line (d) indicates the current waveform of the drive current I when the signal (operating state) Vf of the detection element 304 is detected to be higher than the reference voltage V1. Line (e) indicates the current waveform of the drive current $I_A$ when the signal (operating state) Vf of the detection element 304 is detected to be higher than the reference voltage V2 and equal to or lower than the reference voltage V1. Line (f) indicates the current waveform of the drive current $I_A$ when the signal (operating state) Vf of the detection element 304 is detected to be equal to or lower than the reference voltage V2. Correction currents Icor1, Icor2, and Icor3 in lines (d), (e), and (f) of FIG. 8 are supplied in respective operating states of the detection element 304. They have a relation of Icor1<Icor2<Icor3.

Line (g) in FIG. 8 indicates the light amount waveform of the laser beam when the drive current $I_A$ is supplied to the light emitting element 301 in each state. As indicated in line (g), supplying the correction current Icor according to the operating state of the detection element 304 from the correction current source 403A in synchronization with the start of supplying the switching current Isw to the light emitting element 301 enables reducing the light emission delay.

Figure 9:
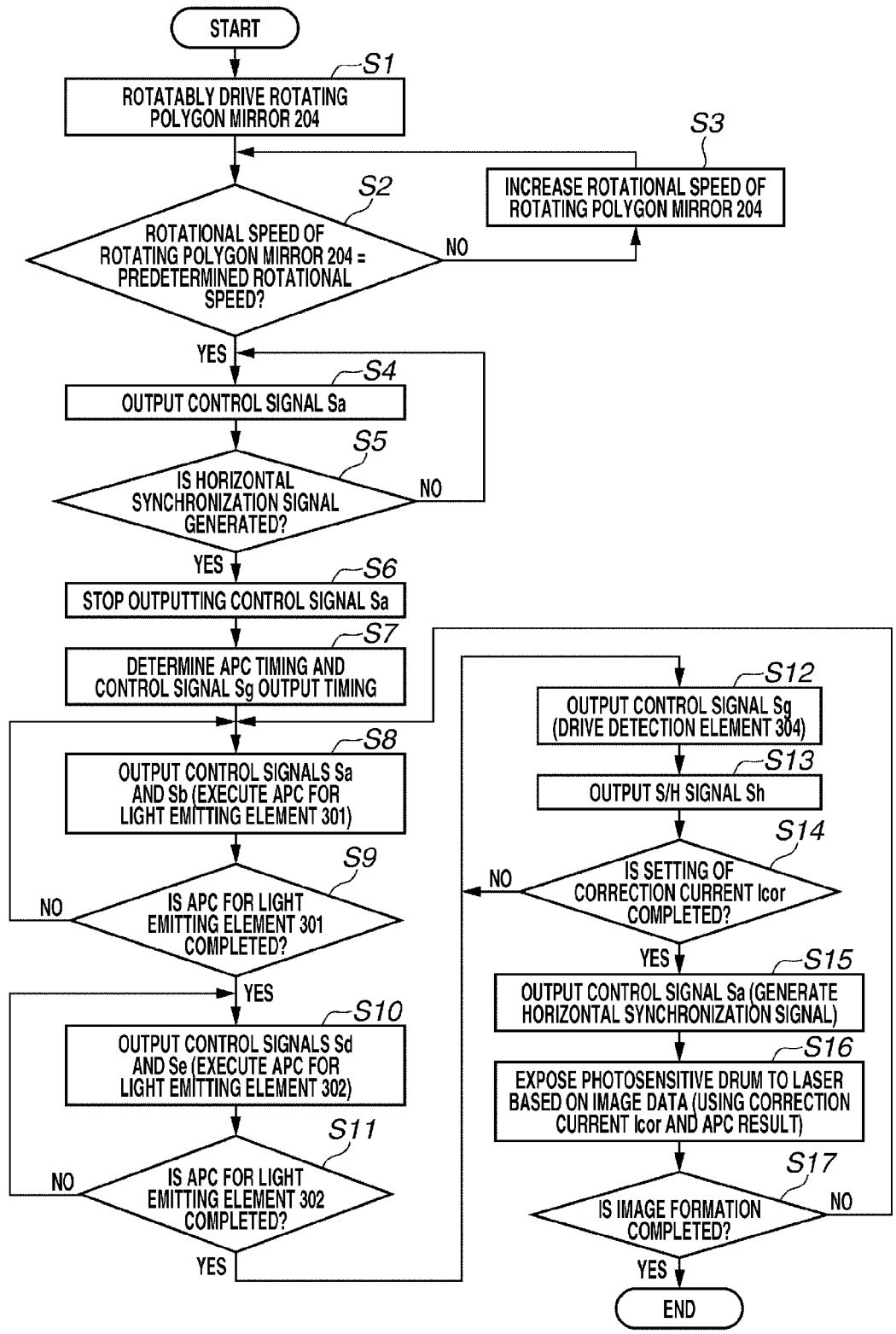
FIG. 9 is a flow chart illustrating control processing performed by a central processing unit (CPU) of the image forming apparatus according to the first exemplary embodiment.
Figure 10:
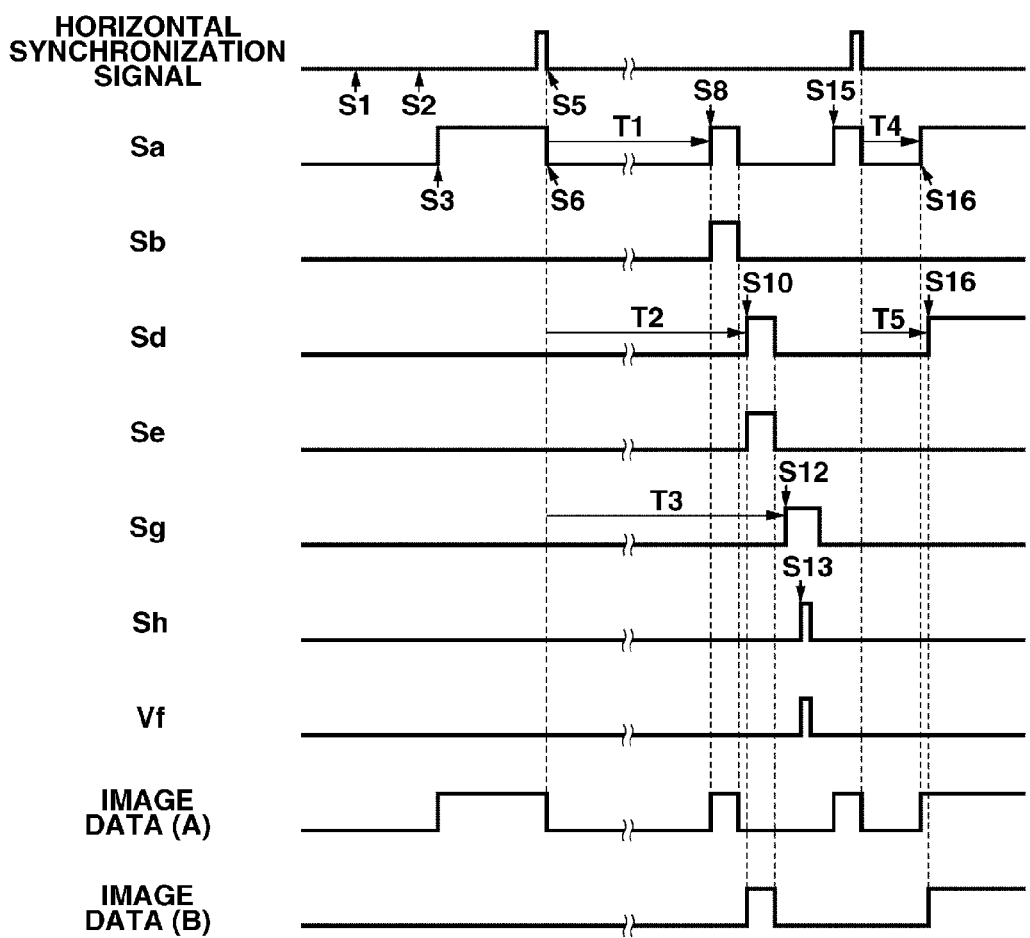
FIG. 10 is a timing chart illustrating generation timing of various signals.

The following describes control processing executed by the CPU 305 and the generation timing of various signals for the control, with reference to FIGS. 9 and 10. FIG. 9 is a flow chart illustrating control processing executed by the CPU 305. FIG. 10 is a timing chart illustrating the generation timing of various signals. FIGS. 9 and 10 will be described below in an associated way.

The CPU 305 starts this control upon input of image data to the image forming apparatus 100. In step S1, upon input of the image data to the image forming apparatus 100, the CPU 305 outputs the control signal Si to the rotating polygon mirror drive motor 311 to rotate the rotating polygon mirror 204. In step S2, the CPU 305 determines whether the rotational speed of the rotating polygon mirror 204 reaches a predetermined rotational speed. When the rotational speed of the rotating polygon mirror 204 is determined not to have reached the predetermined rotational speed (NO in step S2), then in step S3, the CPU 305 increases the rotational speed of the rotating polygon mirror 204.

When the rotational speed of the rotating polygon mirror 204 is determined to have reached the predetermined rotational speed (YES in step S2), then in step S4, the CPU 305 outputs the control signal Sa to the laser drive unit 306A to generate the horizontal synchronization signal. As described above, the AND circuit 404 of the laser drive unit 306A inputs the control signal Sa, and, at this timing, the AND circuit 404 of the laser drive unit 306A inputs the image data of the High level (refer to FIG. 10), then the light emitting element 301 turns ON. In step S5, the CPU 305 determines whether the horizontal synchronization signal has been generated depending on whether the BD 207 detects a laser beam. When the horizontal synchronization signal is determined to have been generated (YES in step S5), then in step S6, the CPU 305 stops outputting the control signal Sa. Otherwise, when the horizontal synchronization signal is determined not to have generated (NO in step S5), the processing returns to step S4 and the CPU 305 continues outputting the control signal Sa.

In step S7, the CPU 305 determines the execution timing of APC for the light emitting elements 301 and 302 and the output timing of the control signal Sg based on the generation timing of the horizontal synchronization signal. As illustrated in FIG. 10, in the present exemplary embodiment, the CPU 305 executes APC for the light emitting elements 301 and 302 when time periods T1 (microseconds) and T2 (microseconds) have elapsed since the generation of the first horizontal synchronization signal, respectively, and outputs the control signal Sg when a time period T3 (microseconds) has elapsed since then.

In step S8, when a predetermined time period (T1) has elapsed since the generation of the horizontal synchronization signal, the CPU 305 outputs the control signals Sa and Sb to the laser drive unit 306A to instruct the laser drive unit 306A to execute APC for the light emitting element 301. The laser drive unit 306A supplies the drive current $I_A$ to the light emitting element 301 according to the control signals Sa and Sb, and the light emitting element 301 outputs a laser beam having a light amount according to the current value of the drive current $I_A$. The CPU 305 executes the above-described APC by using the laser beam emitted when the drive current $I_A$ is supplied.

After completion of APC for the light emitting element 301, the laser drive unit 306A stores the APC result in an internal memory of the current control unit 309A, and, upon completion of storage, transmits an APC completion signal to the CPU 305.

In step S9, the CPU 305 determines whether APC for the light emitting element 301 is completed. When the APC completion signal is determined to have been transmitted from the laser drive unit 306A (YES in step S9), the CPU 305 determines that APC for the light emitting element 301 is completed. Otherwise, when the APC completion signal is determined not to have been transmitted from the laser drive unit 306A (NO in step S9), the CPU 305 determines that APC for the light emitting element 301 is not completed.

When APC for the light emitting element 301 is determined to be completed (YES in step S9), then in step S10, when a specified time period (T2) has elapsed since the generation of the horizontal synchronization signal, the CPU 305 outputs the control signals Sd and Se to the laser drive unit 306B to instruct the laser drive unit 306B to execute APC for the light emitting element 302. The laser drive unit 306B supplies the drive current $I_B$ to the light emitting element 302 according to the control signals Sd and Se, and the light emitting element 302 outputs a laser beam having a light amount according to the current value of the drive current $I_B$. When the drive current $I_B$ is supplied, the above-described APC is executed by using a laser beam emitted.

After completion of APC for the light emitting element 302, the laser drive unit 306B stores the APC result in an internal memory of the current control unit 309B, and, upon completion of storage, transmits the APC completion signal to the CPU 305.

In step S11, the CPU 305 determines whether APC for the light emitting element 302 is completed. When the APC completion signal is determined to have been transmitted from the laser drive unit 306B (YES in step S11), the CPU 305 determines that APC for the light emitting element 302 is completed. Otherwise, when the APC completion signal is determined not to have been transmitted from the laser drive unit 306B (NO in step S11), the CPU 305 determines that APC for the light emitting element 302 is not completed.

In step S12, when the time period T3 (microseconds) has elapsed since the completion of APC for the light emitting element 302 and the generation of the horizontal synchronization signal, the CPU 305 outputs the control signal Sg to the laser drive unit 306A. In response to the control signal Sg, the switch 310A of the laser drive unit 306A turns ON, and a drive current IC having a predetermined value is supplied to the detection element 304. In step S13, the CPU 305 outputs the S/H signal Sh to the S/H circuits 308A and 308B. In response to the S/H signal Sh, the S/H circuits 308A and 308B detect the voltage Vf applied to the detection element 304, thus detecting the operating state of the detection element 304. The current control units 309A and 309B control the switches SWa and SWb, respectively, based on the voltage Vf as described above to set the value of the correction current Icor corresponding to the temperature of the laser light source 201. Upon completion of control of the switches SWa and SWb, the current control units 309A and 309B output the completion signal to the CPU 305, respectively.

In step S14, the CPU 305 determines whether the setting of the correction current Icor is completed. When the completion signal is determined to have been transmitted from the current control units 309A and 309B, the CPU 305 determines that the setting of the correction current Icor is completed. Otherwise, when the completion signal is determined not to have been transmitted from the current control units 309A and 309B, the CPU 305 determines that the setting of the correction current Icor is not completed.

When the setting of the correction current Icor is determined to be completed (YES in step S14), then in step S15, the CPU 305 outputs the control signal Sa to the laser drive unit 306A to generate the horizontal synchronization signal. In this case, the CPU 305 also outputs image data for turning ON the light emitting element 301 to the laser drive unit 306A. Upon output of the control signal Sa from the CPU 305 in step S15, the current control unit 309A of the laser drive unit 306A supplies the bias current Ib, the switching current Isw, and the correction current Icor to the light emitting element 301. Upon input of these signals, the light emitting element 301 emits a laser beam, which enters the BD 207. In step S16, based on the generation timing of the horizontal synchronization signal (when time periods T4 and T5 (microseconds) have elapsed), the CPU 305 exposes the photosensitive drum 102 to laser based on the image data. When exposing the photosensitive drum 102 to laser in step S16, the values of the APC results stored in the above-described internal memories is used. In step S17, the CPU 305 determines whether image formation is completed. When image formation is completed (YES in step S17), the processing exits this control processing. Otherwise, when image formation is determined to be not completed (NO in step S17), the processing returns to step S8.

Steps S8 to S15 and S17 are executed in a period during which the laser beam scans the non-image forming region in one scanning period of the laser beam. Step S16 is executed in a period during which the laser beam scans the image forming region in one scanning period.

Although not illustrated in the flowchart, for example, if APC for the light emitting element 301 is determined not to be completed even when a time period T2 (microseconds) has elapsed since the generation of the horizontal synchronization signal in step S5, the CPU 305 stops this control and notifies the user of an error. Although, in the present exemplary embodiment, the result of detection of the operating state of the detection element 304 is used for correction when starting supplying the switching current Isw, it is also possible to correct the drive current supplied since the start until the end of the supply of the switching current Isw based on the result of detection of the operating state of the detection element 304.

Although, in the present exemplary embodiment, the detection element 304 is driven by the laser drive unit 309A, exemplary embodiments are not limited to this configuration. A dedicated drive unit for driving the detection element 304 may be provided.

Thus, according to the configuration of the present exemplary embodiment, the light amount of a laser beam to be emitted by the light emitting element 301 (the light amount at the start of switching current supply) and the light amount of a laser beam to be emitted by the light emitting element 302 (the light amount at the start of switching current supply) are controlled based on the operating state of the detection element 304 driven by the laser drive unit 306A, enabling restricting the generation of a difference in light volume between the light emitting elements 301 and 302. Further, since the laser drive unit 306A drives the detection element 304, and the laser drive unit 306B does not drive the detection element 304, a control program to be executed in the non-image forming region by the CPU 305 can be simplified.

The first exemplary embodiment has been described to control the light amount of each light emitting element based on the APC result using a photo diode of each light emitting element, and on the result of detection of the operating state of the detection element 304. An image forming apparatus according to a second exemplary embodiment is not provided with a photo diode for detecting a laser beam, and controls the light amount of the light emitting elements 301 and 302 based only on the result of detection of the operating state of the detection element 304. The image forming apparatus according to the second exemplary embodiment does not require the correction current source for supplying the correction current Icor to the light emitting element.

Figure 11:
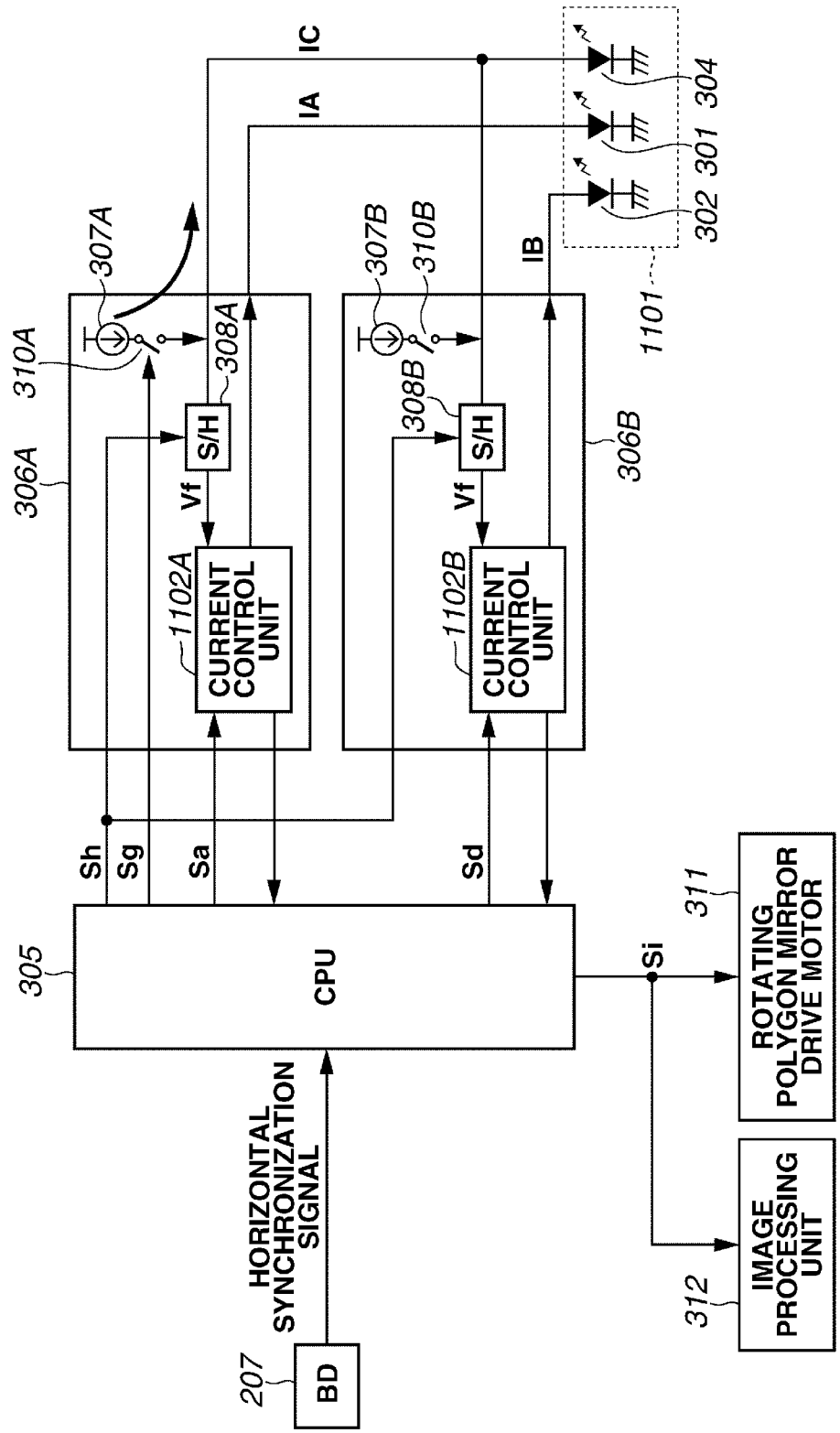
FIG. 11 is a control block diagram illustrating an image forming apparatus according to a second exemplary embodiment.

FIG. 11 is a control block diagram illustrating the image forming apparatus according to the second exemplary embodiment. As illustrated in FIG. 11, a laser light source 1101 according to the present exemplary embodiment is not provided with a photo diode (PD) for detecting a laser beam. Therefore, unlike the configuration in FIG. 3, the image forming apparatus according to the present exemplary embodiment is not provided with wiring from the photo diode to current control circuits 1102A and 1102B. Referring to FIG. 11, elements assigned the same reference numerals as those in FIG. 3 have similar functions to those in FIG. 3, and a redundant description thereof will be omitted.

Figure 12:
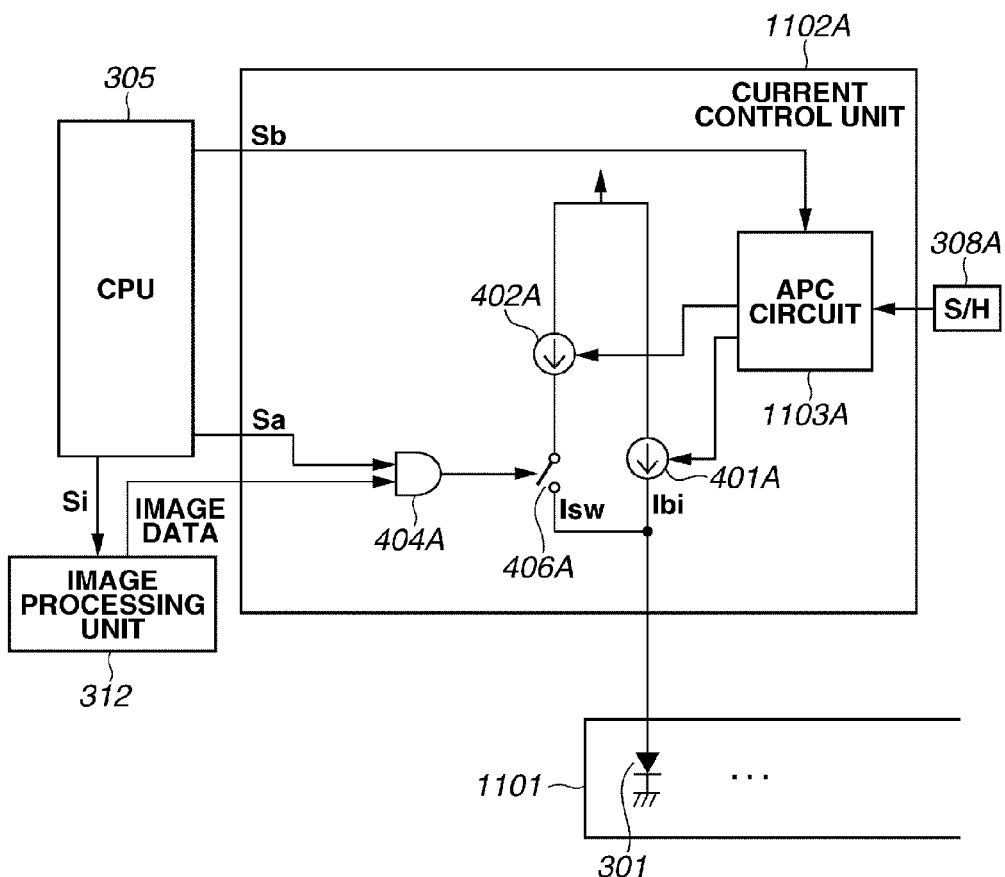
FIG. 12 is a block diagram illustrating a current control circuit according to the second exemplary embodiment.

FIG. 12 illustrates in detail the current control unit 1102A illustrated in FIG. 11. The current control units 1102A and 1102B have an identical configuration, and, therefore, a description will be made on the current control unit 1102A, and a description about the current control unit 1102B will be omitted. Referring to FIG. 12, elements assigned the same reference numerals as those in FIG. 4 have similar functions to those in FIG. 4, and a redundant description thereof will be omitted.

The current control unit 1102A according to the present exemplary embodiment includes an APC circuit 1103A. The APC circuit 1103A inputs a detection signal (Vf) from the S/H circuit 308A. The APC circuit 1103A compares a reference voltage Vref stored in an internal memory with the voltage Vf of the detection signal output from the S/H circuit 308A, and, based on the result of the comparison, controls the value of the switching current Isw supplied from the switching current source 402A of the laser drive unit 1102A to the light emitting element 301. For example, when Vf<Vref (Vref is equivalent to Vf when the temperature of the laser light source 1101 is 25 degrees (Celsius)), the temperature of the laser light source 1101 is higher than 25 degrees (Celsius). In this case, if the value of the switching current Isw is not increased, the light amount of the light emitting element 301 will become smaller than that when the temperature of the laser light source 1101 is 25 degrees (Celsius). Then, the APC circuit 1103A of the laser drive unit 1102A increases the switching current Isw supplied to the light emitting element 301 so as to become larger than the switching current corresponding to Vref.

Otherwise, when Vf>Vref, the temperature of the laser light source 1101 is lower than 25 degrees (Celsius). In this case, if the value of the switching current Isw is not decreased, the light amount of the light emitting element 301 will exceed the target light amount. Then, the APC circuit 1103A of the laser drive unit 1102A decreases the switching current Isw supplied to the light emitting element 301 so as to become smaller than the switching current corresponding to Vref.

When Vf=Vref, the APC circuit 1103A of the laser drive unit 1102A controls the switching current Isw to a value corresponding to the temperature of the laser light source 1101 of 25 degrees (Celsius).

Figure 13:
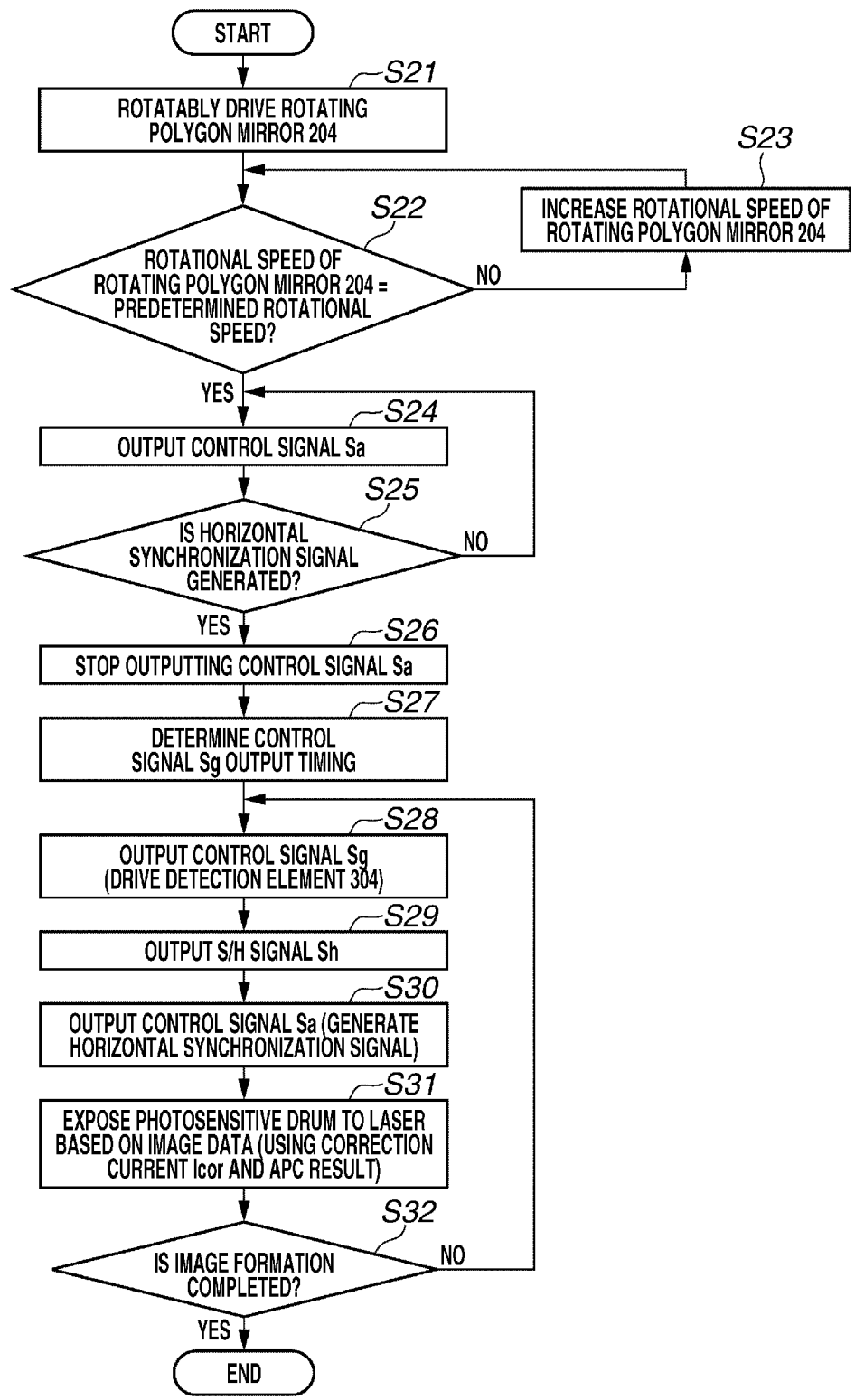
FIG. 13 is a flow chart illustrating control processing executed by a CPU of the image forming apparatus according to the second exemplary embodiment.

FIG. 13 is a flow chart illustrating control processing executed by the CPU 305. Steps S21 to S26 are the same as steps S1 to S6 illustrated in FIG. 9, and descriptions thereof will be omitted.

Figure 14:
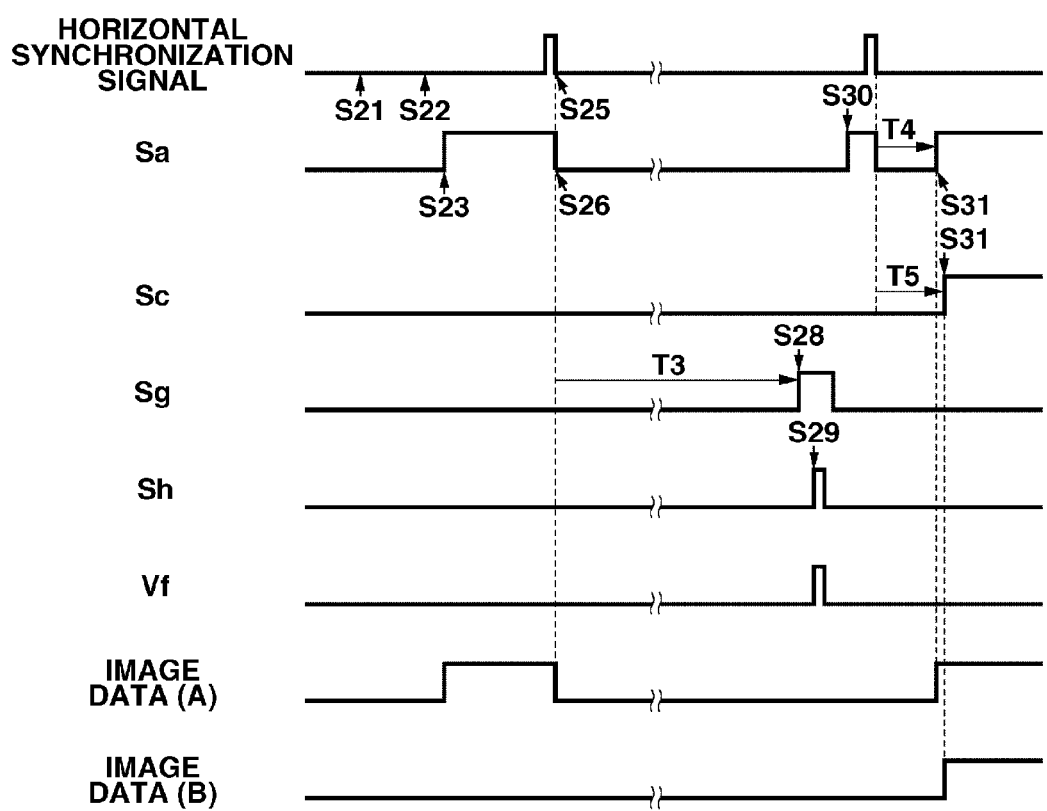
FIG. 14 is a timing chart illustrating generation timing of various signals.

In step S27, the CPU 305 determines the output timing of the control signal Sg. In the present exemplary embodiment, the CPU 305 outputs the output timing of the control signal Sg when a time period T3 (microseconds) has elapsed since the generation of the horizontal synchronization signal, as illustrated in FIG. 14. In step S28, the CPU 305 outputs the control signal Sg when the time period T3 (microseconds) has elapsed since the generation of the synchronization signal in step S25. In step S29, the CPU 305 outputs the S/H signal Sh. The switch 310A turns ON by the control signal Sg, and the predetermined drive current Ic is supplied to the detection element 304. Then, the S/H circuits 308A and 308B detect the voltage Vf applied to the detection element 304. The current control units 1102A and 1102B calculate the value of the switching current Isw based on the voltage Vf. The current control units 1102A and 1102B store the value of the switching current Isw in respective internal memories. Thus, the value of the switching current Isw corresponding to the temperature of the laser light source 1101 is set.

In step S30, the CPU 305 outputs the control signal Sa for generating the horizontal synchronization signal to the laser drive unit 1102A. Based on the control signal Sa output from the CPU 305 in step S30, the laser drive unit 1102A supplies the bias current Ib and the switching current Isw to the light emitting element 301. Upon input of these signals, the light emitting element 301 emits a laser beam, which enters the BD 207. In step S31, based on the generation timing of the horizontal synchronization signal (when the time periods T4 and T5 (microseconds) have elapsed), the CPU 305 exposes the photosensitive drum 102 to laser based on the image data. When exposing the photosensitive drum 102 to laser in step S31, the value of the switching current Isw (APC result) stored in the internal memories is used. In step S32, the CPU 305 determines whether image formation is completed. When image formation is determined to be completed (YES in step S32), the processing exits this control processing. Otherwise, when image formation is determined to be not completed (NO in step S32), the processing returns to step S28.

Although, in the present exemplary embodiment, the value of the switching current is controlled based only on the operating state of the detection element without using the PD, the value of the switching current may be controlled based on the detection result of the PD and the operating state of the detection element.

The configuration of the present exemplary embodiment enables a plurality of current control units to control the light amount of a laser beam emitted from a light emitting element controlled (driven) by each control unit, based on the operating state of the detection element.

Figure 15:
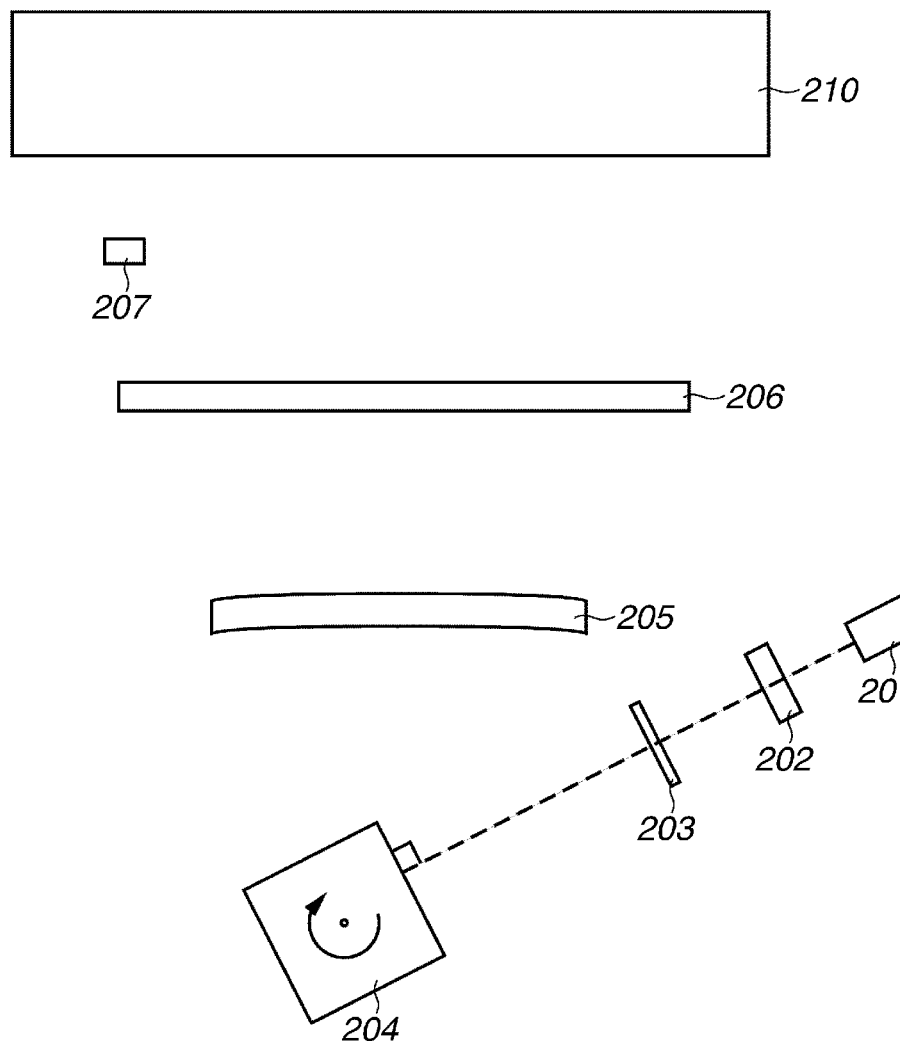
FIG. 15 illustrates a state of the optical scanning apparatus at a timing of detecting the operating state of the detection element.

In a third exemplary embodiment, suitable timing for detecting the operating state of the detection element will be described below. FIG. 15 is a top view illustrating the optical scanning apparatus 104 when the time period T3 (microseconds) has elapsed since the generation of the horizontal synchronization signal in FIG. 10. Referring to FIG. 15, the dotted line indicates an optical path of a laser beam emitted from the laser light source 201 when the time period T3 (microseconds) has elapsed since the generation of the horizontal synchronization signal. As illustrated in FIG. 15, when a laser beam is emitted from the laser light source 201 when the time period T3 (microseconds) has elapsed since the generation of the horizontal synchronization signal, the laser beam perpendicularly enters the reflection surface of the polygon mirror 204. Then, the laser beam that has perpendicularly entered the reflection surface of the polygon mirror 204 is reflected by the reflection surface, and then enters the laser light source 201 again. If the reflected light reflected by the polygon mirror 204 enters the laser light source 201, the laser light source 201 may fail. Therefore, in the image forming apparatus according to the present exemplary embodiment, the laser light source 201 is configured so that the laser beam may not be emitted at the timing at which the laser beam perpendicularly enters the reflection surface of the polygon mirror 204 (when the time period T3 (microseconds) has elapsed since the generation of the horizontal synchronization signal in the present exemplary embodiment). Specifically, in the image forming apparatus according to the present exemplary embodiment, the laser light source 201 emits neither the laser beam for forming an electrostatic latent image on the photosensitive drum 102 nor the laser beam for executing APC at the timing at which the laser beam perpendicularly enters the reflection surface of the polygon mirror 204. At this timing, no laser beam is emitted and, therefore, the CPU 305 outputs the control signal Sg to the laser drive unit 306A to supply the drive current Ic to the detection element 304 to drive the detection element 304.

Although, in the present exemplary embodiment, the drive current Ic is supplied to the detection element 304 to detect the operating state of the detection element 304 after completion of APC for the plurality of light emitting elements, exemplary embodiments are not limited to this configuration. Specifically, the timing at which a laser beam perpendicularly enters the reflection surface of the polygon mirror 204 depends on a relative positional relation between the laser light source 201, the polygon mirror 204, and the photosensitive drum 102. Therefore, the timing at which APC for the light emitting element is not executed during the non-image forming region scanning period depends on the above-described relative positional relation. Therefore, the timing at which the drive current Ic is supplied to the detection element 304 is determined by the relative positional relation among the laser light source 201, the polygon mirror 204, and the photosensitive drum 102.

Further, the timing at which a laser beam for exposing the photosensitive drum 102 to laser is not emitted from all of the light emitting elements even during the image forming region scanning period can be identified based on the input image data. Therefore, the CPU 305 may identify the timing at which the light emitting elements are not turned ON based on the input image data, and output the control signal Sg at the relevant timing. Then, the CPU 305 controls the light amount of laser beams subsequently emitted from the light emitting elements based on the detection result of the detection element 304.

Thus, since the image forming apparatus according to the present exemplary embodiment is configured to detect the operating state of the detection element 304 at the timing at which the plurality of light emitting elements do not turn ON, the operating state of the detection element 304 can be detected without being affected by the heat from the light emitting elements.

Thus, according to the configuration of the present exemplary embodiment, the light amount of a laser beam to be emitted by the light emitting element 301 (the light amount at the start of switching current supply) and the light amount of a laser beam to be emitted by the light emitting element 302 (the light amount at the start of switching current supply) are controlled based on the operating state of the detection element 304 driven by the laser drive unit 306A, enabling restricting the generation of a difference in light volume between the light emitting elements 301 and 302. Further, since the laser drive unit 306A drives the detection element 304, and the laser drive unit 306B does not drive the detection element 304, a control program executed by the CPU 305 for the non-image forming region can be simplified.

According to the exemplary embodiments of the present invention, it is possible to restrict the generation of a difference in light volume between a light beam emitted from the first light emitting element driven by the first drive unit and a light beam emitted from the second light emitting element driven by the second drive unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2012-098681 filed Apr. 24, 2012 and No. 2012-100969 filed Apr. 26, 2012, which are hereby incorporated by reference herein in their entirety.

The invention claimed is:

1. A light emission apparatus comprising:
a light source including a plurality of light emitting elements including a first light emitting element and a second light emitting element configured to emit a light beam, and a detection element;
a first drive unit configured to drive the first light emitting element to emit the light beam and configured to drive the detection element by supplying, to the detection element, a detection current having a predetermined value;
a second drive unit configured to drive the second light emitting element to emit the light beam; and
a detection unit configured to detect, as an operating state of the detection element, a voltage of the detection element to which the detection current is supplied by the first drive unit,
wherein the first drive unit controls a light amount of the light beam to be emitted by the first light emitting element based on the voltage of the detection element detected by the detection unit, and the second drive unit controls a light amount of the light beam to be emitted by the second light emitting element based on the voltage of the detection element detected by the detection unit.

2. The light emission apparatus according to claim 1, wherein the first drive unit supplies a current for driving the first light emitting element to emit the light beam,
wherein the second drive unit supplies a current for driving the second light emitting element to emit the light beam,
wherein the first drive unit controls a value of the current supplied to the first light emitting element based on the voltage detected by the detection unit to control the light amount of the light beam to be emitted by the first light emitting element, and
wherein the second drive unit controls a value of the current supplied to the second light emitting element based on the voltage detected by the detection unit to control the light amount of the light beam to be emitted by the second light emitting element.

3. The light emission apparatus according to claim 1, wherein the first drive unit supplies a first drive current to the first light emitting element based on image data, and supplies to the first light emitting element a first correction current which decreases from a first peak value in synchronization with start of supplying the first drive current,
wherein the second drive unit supplies a second drive current to the second light emitting element based on image data, and supplies to the second light emitting element a second correction current which decreases from a second peak value in synchronization with start of supplying the second drive current, and
wherein the first drive unit controls a value of the first correction current supplied to the first light emitting element based on the operating state so that the first peak value is controlled to become a value corresponding to the operating state detected by the detection unit, and the second drive unit controls a value of the second correction current supplied to the second light emitting element based on the operating state so that the second peak value is controlled to become a value corresponding to the operating state detected by the detection unit.

4. An optical scanning apparatus comprising:
the light emission apparatus according to claim 1;
a deflection unit configured to deflect the plurality of light beams emitted from the light source so that the plurality of light beams emitted from the light source scan a photosensitive member;
a signal generation unit configured to generate a synchronization signal in response to reception of the light beams deflected by the deflection unit; and
a control unit configured to, based on generation timing of the synchronization signal, cause the first drive unit to drive the detection element and cause the detection unit to detect the operating state of the detection element.

5. The optical scanning apparatus according to claim 4, wherein, at a timing other than a period for scanning an image forming region on the photosensitive member in one scanning period of the light beam, the control unit causes the first drive unit to drive the detection element and causes the detection unit to detect the operating state of the detection element.

6. The optical scanning apparatus according to claim 5, wherein, based on the operating state of the detection element, each of the first drive unit and the second drive unit controls a light amount of the light beam for scanning the image forming region on the photosensitive member emitted based on image data.

7. A light emission apparatus comprising:
a light source including a plurality of light emitting elements including a first light emitting element and a second light emitting element configured to emit a light beam, and a detection element;
a first drive unit configured to drive the first light emitting element to emit the light beam;
a second drive unit configured to drive the second light emitting element to emit the light beam; and
a detection unit configured to detect an operating state of the detection element,
wherein the first drive unit controls a light amount of the light beam to be emitted by the first light emitting element based on the operating state of the detection element detected by the detection unit, and the second drive unit controls a light amount of the light beam to be emitted by the second light emitting element based on the operating state of the detection element detected by the detection unit,
wherein the detection unit includes a first detection unit disposed in the first drive unit and configured to detect the operating state of the detection element driven by the first drive unit, and a second detection unit disposed in the second drive unit and configured to detect the operating state of the detection element driven by the first drive unit, and
wherein the first drive unit controls the light amount of the light beam to be emitted by the first light emitting element based on the operating state of the detection element detected by the first detection unit, and the second drive unit controls the light amount of the light beam to be emitted by the second light emitting element based on the operating state of the detection element detected by the second detection unit.

8. An optical scanning apparatus comprising:
a light source including a plurality of light emitting elements including a first light emitting element and a second light emitting element configured to emit a light beam, and a detection element;
a light receiving unit configured to receive the plurality of light beams emitted from the light source;

a first drive unit configured to drive the first light emitting element to emit the light beam;
a second drive unit configured to drive the second light emitting element to emit the light beam;
a detection unit configured to detect an operating state of the detection element;
a deflection unit configured to deflect the plurality of light beams so that the plurality of light beams emitted from the light source scan a photosensitive member;
a signal generation unit configured to generate a synchronization signal in response to reception of the light beams deflected by the deflection unit; and
a control unit configured to, based on generation timing of the synchronization signal, cause the first drive unit to drive the detection element and cause the detection unit to detect the operating state of the detection element,
wherein the first drive unit controls a drive current supplied to the first light emitting element based on a light amount of the light beam received from the first light emitting element by the light receiving unit so that the light beam emitted from the first light emitting element reaches a target light amount, and supplies to the first light emitting element a correction current having a value corresponding to the operating state detected by the detection unit, during a predetermined time period since start of supplying the drive current to the first light emitting element, and
wherein the second drive unit controls a drive current supplied to the second light emitting element based on a light amount of the light beam received from the second light emitting element by the light receiving unit so that the light beam emitted from the second light emitting element reaches a target light amount, and supplies to the second light emitting element a correction current having a value corresponding to the operating state detected by the detection unit, during a predetermined time period since start of supplying the drive current to the second light emitting element.

9. An image forming apparatus comprising:
a photosensitive member;
a light source including a plurality of light emitting elements including a first light emitting element and a second light emitting element configured to emit a light beam for exposing the photosensitive member to light, and a detection element;
a first drive unit configured to drive the first light emitting element to emit the light beam and configured to drive the detection element by supplying, to the detection element, a detection current having a predetermined value;
a second drive unit configured to drive the second light emitting element to emit the light beam; and
a detection unit configured to detect, as an operating state of the detection element, a voltage of the detection element to which the detection current is supplied by the first drive unit,
wherein the first drive unit controls a light amount of the light beam to be emitted by the first light emitting element based on the voltage of the detection element detected by the detection unit, and the second drive unit controls a light amount of the light beam to be emitted by the second light emitting element based on the voltage of the detection element detected by the detection unit.

10. The image forming apparatus according to claim 9, wherein the first drive unit supplies a drive current to the first light emitting element, and the second drive unit supplies a drive current to the second light emitting element,
wherein the first drive unit controls a value of the drive current supplied to the first light emitting element based on the voltage detected by the detection unit to control the light amount of the light beam to be emitted by the first light emitting element, and the second drive unit controls a value of the drive current supplied to the second light emitting element based on the voltage detected by the detection unit to control the light amount of the light beam to be emitted by the second light emitting element.

11. The image forming apparatus according to claim 9, further comprising:
a deflection unit configured to deflect the plurality of light beams emitted from the light source so that the plurality of light beams emitted from the light source scan the photosensitive member;
a signal generation unit configured to generate a synchronization signal in response to reception of the light beams deflected by the deflection unit; and
a control unit configured to, based on generation timing of the synchronization signal, cause the first drive unit to drive the detection element and cause the detection unit to detect the operating state of the detection element.

12. The image forming apparatus according to claim 11, wherein, at a timing other than a period for scanning an image forming region on the photosensitive member in one scanning period of the light beam, the control unit causes the first drive unit to drive the detection element and causes the detection unit to detect the operating state of the detection element.

13. The image forming apparatus according to claim 12, wherein, based on the operating state of the detection element, each of the first drive unit and the second drive unit controls a light amount of the light beam for scanning the image forming region on the photosensitive member emitted based on image data.

14. An image forming apparatus comprising:
a photosensitive member;
a light source including a plurality of light emitting elements including a first light emitting element and a second light emitting element configured to emit a light beam for exposing the photosensitive member to light, and a detection element;
a first drive unit configured to drive the first light emitting element to emit the light beam;
a second drive unit configured to drive the second light emitting element to emit the light beam; and
a detection unit configured to detect an operating state of the detection element,
wherein the first drive unit controls a light amount of the light beam to be emitted by the first light emitting element based on the operating state of the detection element detected by the detection unit, and the second drive unit controls a light amount of the light beam to be emitted by the second light emitting element based on the operating state of the detection element detected by the detection unit,
wherein the detection unit includes a first detection unit disposed in the first drive unit and configured to detect the operating state of the detection element driven by the first drive unit, and a second detection unit disposed in the second drive unit and configured to detect the operating state of the detection element driven by the first drive unit, and
wherein the first drive unit controls the light amount of the light beam to be emitted by the first light emitting element based on the operating state of the detection element detected by the first detection unit, and the second drive unit controls the light amount of the light beam to be emitted by the second light emitting element based on the operating state of the detection element detected by the second detection unit.

15. An image forming apparatus comprising:

a photosensitive member;

a light source including a plurality of light emitting elements including a first light emitting element and a second light emitting element configured to emit a light beam for exposing the photosensitive member to light, and a detection element;

a first drive unit configured to drive the first light emitting element to emit the light beam;

a second drive unit configured to drive the second light emitting element to emit the light beam; and a detection unit configured to detect an operating state of the detection element, a light receiving unit configured to receive the plurality of light beams emitted from the light source, wherein the first drive unit controls a light amount of the light beam to be emitted by the first light emitting element based on the operating state of the detection element detected by the detection unit, and the second drive unit controls a light amount of the light beam to be emitted by the second light emitting element based on the operating state of the detection element detected by the detection unit, and wherein the first drive unit controls a drive current supplied to the first light emitting element based on a light amount of the light beam received from the first light emitting element by the light receiving unit so that the light beam emitted from the first light emitting element reaches a target light amount, and supplies to the first light emitting element a correction current having a value corresponding to the operating state detected by the detection unit, during a predetermined time period since start of supplying the drive current to the first light emitting element, and wherein the second drive unit controls a drive current supplied to the second light emitting element based on a light amount of the light beam received from the second light emitting element by the light receiving unit so that the light beam emitted from the second light emitting element reaches a target light amount, and supplies to the second light emitting element a correction current having a value corresponding to the operating state detected by the detection unit, during a predetermined time period since start of supplying the drive current to the second light emitting element.

\* \* \* \* \*